(12) United States Patent
Ripley et al.

(10) Patent No.: US 11,637,535 B2
(45) Date of Patent: *Apr. 25, 2023

(54) DEVICES AND METHODS FOR DETECTING A SATURATION CONDITION OF A POWER AMPLIFIER

(71) Applicant: SKYWORKS SOLUTIONS, INC., Irvine, CA (US)

(72) Inventors: David Steven Ripley, Marion, IA (US); Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/367,624

(22) Filed: Jul. 6, 2021

(65) Prior Publication Data
US 2022/0014155 A1 Jan. 13, 2022

Related U.S. Application Data

(60) Continuation of application No. 16/427,346, filed on May 31, 2019, now Pat. No. 11,057,003, which is a (Continued)

(51) Int. Cl.
*H03F 1/22* (2006.01)
*H03F 3/191* (2006.01)
(Continued)

(52) U.S. Cl.
CPC ............. *H03F 1/32* (2013.01); *H03F 1/0211* (2013.01); *H03F 1/0227* (2013.01); *H03F 1/22* (2013.01);
(Continued)

(58) Field of Classification Search
CPC ........ H03F 1/32; H03F 1/0211; H03F 1/0227; H03F 1/22; H03F 1/56; H03F 3/19;
(Continued)

(56) References Cited

U.S. PATENT DOCUMENTS 3,922,614 A 11/1975 van de Plassche
4,030,042 A 6/1977 Limberg
(Continued)

FOREIGN PATENT DOCUMENTS

CN 1572055 1/2005
CN 101888212 11/2010
(Continued)

*Primary Examiner* — Khanh V Nguyen
(74) *Attorney, Agent, or Firm* — Chang & Hale LLP

(57) ABSTRACT

The present disclosure relates to devices and methods for detecting and preventing occurrence of a saturation state in a power amplifier. A power amplifier module can include a power amplifier including a cascode transistor pair. The cascode transistor pair can include a first transistor and a second transistor. The power amplifier module can include a current comparator configured to compare a first base current of the first transistor and a second base current of the second transistor to obtain a comparison value. The power amplifier module can include a saturation controller configured to supply a reference signal to an impedance matching network based on the comparison value. The impedance matching network can be configured to modify a load impedance of a load line in electrical communication with the power amplifier based at least in part on the reference signal.

20 Claims, 15 Drawing Sheets

Related U.S. Application Data continuation of application No. 15/641,309, filed on Jul. 4, 2017, now Pat. No. 10,312,867, which is a division of application No. 14/867,247, filed on Sep. 28, 2015, now Pat. No. 9,698,736.

(60) Provisional application No. 62/097,877, filed on Dec. 30, 2014, provisional application No. 62/097,899, filed on Dec. 30, 2014, provisional application No. 62/097,941, filed on Dec. 30, 2014.

(51) Int. Cl.

| | | |
|---|---|---|
| *H03F 1/32* | (2006.01) | |
| *H03F 1/56* | (2006.01) | |
| *H03F 1/02* | (2006.01) | |
| *H03F 3/24* | (2006.01) | |
| *H04L 25/02* | (2006.01) | |
| *H04B 1/04* | (2006.01) | |
| *H04L 27/04* | (2006.01) | |
| *H03F 3/19* | (2006.01) | |
| *H03F 3/21* | (2006.01) | |
| *H04B 1/40* | (2015.01) | |
| *H03F 1/30* | (2006.01) | |
| *H03G 3/30* | (2006.01) | |

(52) U.S. Cl.
CPC ............ *H03F 1/56* (2013.01); *H03F 3/19* (2013.01); *H03F 3/191* (2013.01); *H03F 3/21* (2013.01); *H03F 3/24* (2013.01); *H03F 3/245* (2013.01); *H04B 1/0475* (2013.01); *H04B 1/40* (2013.01); *H04L 25/0278* (2013.01); *H04L 27/04* (2013.01); *H03F 1/0261* (2013.01); *H03F 1/30* (2013.01); *H03F 1/302* (2013.01); *H03F 2200/171* (2013.01); *H03F 2200/451* (2013.01); *H03F 2200/462* (2013.01); *H03F 2200/555* (2013.01); *H03F 2200/78* (2013.01); *H03G 3/3042* (2013.01); *H04B 2001/0408* (2013.01)

(58) Field of Classification Search
CPC ... H03F 3/191; H03F 3/21; H03F 3/24; H03F 3/245; H03F 1/0261; H03F 1/30; H03F 1/302; H03F 2200/171; H03F 2200/451; H03F 2200/462; H03F 2200/555; H03F 2200/78; H03F 1/223; H03F 2200/294; H03F 1/565; H04B 1/0475; H04B 1/40; H04B 2001/0408; H04L 25/0278; H04L 27/04; H03G 3/3042
USPC .......................................... 330/296, 302, 311
See application file for complete search history.

(56) References Cited

U.S. PATENT DOCUMENTS

| | | |
|---|---|---|
| 5,652,547 A | 7/1997 | Mokhtar et al. |
| 5,963,096 A | 10/1999 | Hoshino |
| 6,043,711 A | 3/2000 | Kim |
| 6,538,495 B2 | 3/2003 | Goutti et al. |
| 6,965,270 B1 | 11/2005 | Ross |
| 7,304,539 B2 | 12/2007 | Tsurumaki et al. |
| 3,008,974 A1 | 8/2011 | Ha et al. |
| 8,018,277 B2* | 9/2011 | Drogi ................. H03F 3/19 330/136 |
| 8,154,345 B2 | 4/2012 | Andrys et al. |
| 8,368,470 B2 | 2/2013 | Alidio et al. |
| 8,410,824 B2* | 4/2013 | Mehdizad Taleie ...... H03F 3/72 327/108 |
| 8,432,224 B1 | 4/2013 | Woo et al. |
| 8,749,273 B2 | 6/2014 | Andrys et al. |
| 8,749,309 B2 | 6/2014 | Ho et al. |
| 8,774,739 B2 | 7/2014 | Ripley et al. |
| 8,907,726 B2 | 12/2014 | Ortiz et al. |
| 9,325,282 B2 | 4/2016 | Bowers et al. |
| 9,667,200 B2 | 5/2017 | Ripley |
| 9,698,736 B2 | 7/2017 | Ripley et al. |
| 9,722,547 B2 | 8/2017 | Ripley et al. |
| 9,780,741 B2 | 10/2017 | Ripley et al. |
| 9,893,686 B2 | 2/2018 | Ripley |
| 10,256,778 B2 | 4/2019 | Ishihara et al. |
| 2002/0074980 A1 | 6/2002 | Sander |
| 2002/0077066 A1 | 6/2002 | Pehlke et al. |
| 2003/0160658 A1 | 8/2003 | Cioffi et al. |
| 2005/0083129 A1 | 4/2005 | Tsurumaki et al. |
| 2005/0206455 A1 | 9/2005 | Yamazaki et al. |
| 2007/0080750 A1 | 4/2007 | Liebenrood |
| 2007/0273448 A1 | 11/2007 | Vaiana et al. |
| 2013/0127548 A1 | 5/2013 | Popplewell et al. |
| 2014/0002188 A1 | 1/2014 | Chen et al. |
| 2014/0159818 A1 | 6/2014 | Jeon et al. |
| 2014/0184335 A1 | 7/2014 | Nobbe et al. |
| 2015/0054583 A1 | 2/2015 | Miyashita et al. |
| 2016/0181989 A1 | 6/2016 | Shi et al. |

FOREIGN PATENT DOCUMENTS

| | | |
|---|---|---|
| CN | 102265510 | 11/2011 |
| JP | 07222482 | 8/1995 |
| JP | 09232874 | 9/1997 |
| JP | 1070419 | 3/1998 |
| JP | 11251933 | 9/1999 |
| JP | 2000323935 | 11/2000 |
| JP | 2005502251 | 1/2005 |
| JP | 2005520372 | 7/2005 |
| JP | 2006067379 | 3/2006 |
| JP | 2007189621 | 7/2007 |
| JP | 2008506337 | 2/2008 |
| JP | 2008219620 | 9/2008 |
| JP | 2011120057 | 6/2011 |
| JP | 2014183463 | 9/2014 |
| KR | 1020030061000 | 7/2003 |
| KR | 1020080031999 | 4/2008 |
| KR | 101004851 | 12/2010 |
| KR | 101124914 | 3/2012 |
| KR | 1020140142466 | 12/2014 |
| TW | I226156 | 1/2005 |
| TW | 200721667 | 6/2007 |
| TW | 201429156 | 7/2014 |
| WO | 03/021766 | 3/2003 |
| WO | 2008044276 | 4/2008 |
| WO | 2012/151594 | 8/2012 |

\* cited by examiner

DEVICES AND METHODS FOR DETECTING A SATURATION CONDITION OF A POWER AMPLIFIER

CROSS-REFERENCE TO RELATED APPLICATION(S)

This application is a continuation of U.S. patent application Ser. No. 16/427,346, filed May 31, 2019, entitled "DEVICES AND METHODS FOR DETECTING A SATURATION CONDITION OF A POWER AMPLIFIER," which is a continuation of U.S. patent application Ser. No. 15/641,309, filed Jul. 4, 2017, entitled "METHODS, MODULES AND DEVICES FOR DETECTING A SATURATION CONDITION OF A POWER AMPLIFIER," now U.S. Pat. No. 10,312,867, issued Jun. 4, 2019, which is a divisional of U.S. patent application Ser. No. 14/867,247, filed Sep. 28, 2015, entitled "COMPRESSION CONTROL THROUGH POWER AMPLIFIER LOAD ADJUSTMENT," now U.S. Pat. No. 9,698,736, issued Jul. 4, 2017, which claims priority to U.S. Provisional Application No. 62/097,877, filed Dec. 30, 2014, entitled "COMPRESSION CONTROL THROUGH POWER AMPLIFIER LOAD ADJUSTMENT," U.S. Provisional Application No. 62/097,899, filed Dec. 30, 2014, entitled "COMPRESSION CONTROL THROUGH AMPLITUDE ADJUSTMENT OF A RADIO FREQUENCY INPUT SIGNAL," and U.S. Provisional Application No. 62/097,941, filed Dec. 30, 2014, entitled "COMPRESSION CONTROL THROUGH POWER AMPLIFIER VOLTAGE ADJUSTMENT," the disclosure of each of which is hereby expressly incorporated by reference herein in its entirety.

BACKGROUND

Field

The present disclosure generally relates to wireless communication systems having a cascode power amplifier.

Description of the Related Art

Many wireless devices include one or more linear power amplifiers. In order for the power amplifier to accurately amplify the received signal, it is desirable to avoid compression of the signal. When the power amplifier compresses the signal, the power amplifier output may no longer be linearly related to its input and the modulated waveform may become distorted. Further, the signal spectrum may change and start to degrade causing spectrum to spread into adjacent areas of the band and violate system specifications. The spreading of the spectrum into adjacent channels can interfere with other wireless devices thereby negatively impacting other wireless devices.

SUMMARY

In accordance with some implementations, the present disclosure relates to a power amplifier module including a power amplifier. The power amplifier includes a cascode transistor pair. The cascode transistor pair includes a first transistor and a second transistor. The power amplifier module includes a power amplifier bias controller. The power amplifier bias controller includes a current comparator configured to compare a first base current of the first transistor and a second base current of the second transistor to obtain a comparison value. The power amplifier module includes a saturation controller configured to supply a reference signal to an impedance matching network based on the comparison value. The impedance matching network is configured to modify a load impedance of a load line in electrical communication with the power amplifier based at least in part on the reference signal.

In some embodiments, the first transistor can be a common base transistor and the second transistor can be a common emitter transistor.

In some embodiments, the load line can be in electrical communication with an antenna and the load line can be electrically located between the power amplifier and the antenna.

In some embodiments, the impedance matching network can be a dynamic impedance matching network.

In some embodiments, the saturation controller can be further configured to reduce compression of the power amplifier by modifying the load impedance of the load line.

In some embodiments, the saturation controller can further include a digital-to-analog converter and a ramp generator. The ramp generator can be configured to supply a count value to the digital-to-analog converter and the digital-to-analog converter can be configured to generate the reference signal based at least in part on the count value.

In some embodiments, the saturation controller can include a pull-down resistor in electrical communication with the power amplifier bias controller, a voltage input/output pin and a ramp clock generator. The ramp clock generator can be configured to detect whether the first transistor is operating in a saturation region based on a voltage across the pull-down resistor. The voltage can be based at least in part on the comparison value. In response to detecting that the first transistor is operating in the saturation region, the ramp clock generator can be configured to cause the ramp generator to modify the count value.

In some embodiments, the digital-to-analog converter can be further configured to generate the reference signal based at least in part on an average power tracking value determined based on a target power signal received from a base station.

In some embodiments, the saturation controller can further include a RF front end configured to receive a default data value from a saturation data pin. The count value can initially correspond to the default data value. In some embodiments, the default data value can be one of a plurality of default data values and can be selected based on a target voltage. In some embodiments, the target voltage can be determined based at least in part on a target power signal received from a base station.

In some embodiments, the power amplifier module can further include a boost converter configured to regulate a supply voltage provided to the power amplifier. In some embodiments, the saturation controller can be further configured to reduce compression of the power amplifier by a combination of providing a second reference signal to the boost converter to increase the supply voltage and modifying the load impedance of the load line by supplying the reference signal to the impedance matching network.

In accordance with some implementations, the present disclosure relates to a transceiver including an impedance matching network. The impedance matching network is configured to modify, based on a reference signal, a load impedance of a load line in electrical communication with a power amplifier and an antenna. The transceiver further includes a power amplifier module including the power amplifier, a power amplifier bias controller, and a saturation controller. The power amplifier includes a cascode transistor pair. The cascode transistor pair includes a first transistor and a second transistor. The power amplifier bias controller includes a current comparator configured to compare a base current of the first transistor and a base current of the second transistor to obtain a comparison value. The saturation controller is configured to generate the reference signal based at least in part on the comparison value and to provide the reference signal to the impedance matching network.

In some embodiments, the impedance matching network can be a dynamic impedance matching network.

In some embodiments, the saturation controller can further include a digital-to-analog converter and a ramp generator. The ramp generator can be configured to supply a count value to the digital-to-analog converter and the digital-to-analog converter can be configured to generate the reference signal based at least in part on the count value.

In some embodiments, the saturation controller can include a pull-down resistor in electrical communication with the power amplifier bias controller, a voltage input/output pin, and a ramp clock generator. The ramp clock generator can be configured to detect whether the first transistor is operating in a saturation region based on a voltage across the pull-down resistor, the voltage based at least in part on the comparison value and, in response to detecting that the first transistor is operating in the saturation region, configured to cause the ramp generator to modify the count value.

In some embodiments, the transceiver further includes a boost converter configured to regulate a supply voltage provided to the power amplifier. In some embodiments, the saturation controller is further configured to reduce compression of the power amplifier by a combination of providing a second reference signal to the boost converter to increase the supply voltage and modifying the load impedance of the load line by supplying the reference signal to the impedance matching network.

In accordance with some implementations, the present disclosure relates to a wireless device including an antenna configured to at least transmit a signal from a transceiver, the signal based at least in part on a radio frequency input signal supplied to a power amplifier of the transceiver. The transceiver includes an impedance matching network and a power amplifier module. The impedance matching network is configured to modify, based on a reference signal, a load impedance of a load line in electrical communication with the power amplifier and the antenna. The power amplifier module includes the power amplifier, a power amplifier bias controller, and a saturation controller. The power amplifier includes a cascode transistor pair. The cascode transistor pair includes a first transistor and a second transistor. The power amplifier bias controller includes a current comparator configured to compare a base current of the first transistor and a base current of the second transistor to obtain a comparison value. The saturation controller is configured to generate the reference signal based at least in part on the comparison value and to provide the reference signal to the impedance matching network.

In accordance with some implementations, the present disclosure relates to a power amplifier module including a power amplifier. The power amplifier includes a cascode transistor pair. The cascode transistor pair includes a first transistor and a second transistor. The power amplifier module includes a power amplifier bias controller. The power amplifier bias controller includes a current comparator, a saturation controller, and a radio frequency (RF) attenuator. The current comparator is configured to compare a first base current of the first transistor and a second base current of the second transistor to obtain a comparison value. The saturation controller is configured to supply a reference signal to the RF attenuator based on the comparison value. The RF attenuator is configured to modify the amplitude of an RF input signal supplied to the power amplifier based at least in part on the reference signal.

In some embodiments, the RF attenuator can be a digital attenuator configured to modify the amplitude of the RF input signal based at least in part on an attenuation value. In some embodiments, the attenuation value can be a discrete attenuation value selected from a plurality of discrete attenuation values. Selection of the discrete attenuation value can be based at least in part on the reference signal.

In some embodiments, the RF attenuator can be an analog attenuator configured to modify the amplitude of the RF input signal based at least in part on an attenuation value. In some embodiments, the attenuation value can be based on an analog voltage that is continuously modified until the reference signal indicates that the power amplifier is not operating in a saturated state. In some embodiments, the analog attenuator can determine whether to modify the analog voltage by increasing the analog voltage or decreasing the analog voltage based at least in part on a polarity of the analog attenuator.

In some embodiments, the first transistor can be a common base transistor and the second transistor can be a common emitter transistor.

In some embodiments, the power amplifier module can include a boost converter configured to regulate a supply voltage provided to the power amplifier.

In some embodiments, the saturation controller can further include a digital-to-analog converter and a ramp generator. The ramp generator can be configured to supply a count value to the digital-to-analog converter. The digital-to-analog converter can be configured to generate the reference signal based at least in part on the count value.

In some embodiments, the reference signal can be an 8-bit word that specifies an attenuation value for the RF attenuator. The RF attenuator can modify the amplitude of the RF input signal based at least in part on the attenuation value.

In some embodiments, the saturation controller can include a pull-down resistor in electrical communication with the power amplifier bias controller, a voltage input/output pin, and a ramp clock generator. The ramp clock generator can be configured to detect whether the first transistor is operating in a saturation region based on a voltage across the pull-down resistor. The voltage can be based at least in part on the comparison value. In response to detecting that the first transistor is operating in the saturation region, the ramp clock generator can be configured to cause the ramp generator to modify the count value.

In accordance with some implementations, the present disclosure relates to a transceiver comprising a receiver and a transmitter. The transmitter includes a power amplifier module. The power amplifier module includes a power amplifier and a power amplifier bias controller. The power amplifier includes a cascode transistor pair. The cascode transistor pair includes a first transistor and a second transistor. The power amplifier bias controller includes a current comparator, a saturation controller, and a radio frequency (RF) attenuator. The current comparator is configured to compare a base current of the first transistor and a base current of the second transistor to obtain a comparison value. The saturation controller is configured to supply a reference signal to the RF attenuator based on the comparison value. The RF attenuator is configured to modify the amplitude of an RF input signal supplied to the power amplifier based at least in part on the reference signal.

In some embodiments, the RF attenuator can be a digital attenuator configured to modify the amplitude of the RF input signal based at least in part on an attenuation value. In some embodiments, the attenuation value can be a discrete attenuation value selected from a plurality of discrete attenuation values. Selection of the discrete attenuation value can be based at least in part on the reference signal.

In some embodiments, the RF attenuator can be an analog attenuator configured to modify the amplitude of the RF input signal based at least in part on an attenuation value. In some embodiments, the attenuation value can be based at least in part on an analog voltage that is continuously modified until the reference signal indicates that the power amplifier is not operating in a saturated state. In some embodiments, the analog attenuator can determine whether to modify the analog voltage by increasing the analog voltage or decreasing the analog voltage based at least in part on a polarity of the analog attenuator.

In accordance with some implementations, the present disclosure relates to a wireless device including an antenna configured to at least transmit a signal from a transmitter, the signal being based at least in part on a radio frequency input signal supplied to a power amplifier of the transmitter. The transmitter includes a power amplifier module. The power amplifier module includes the power amplifier and a power amplifier bias controller. The power amplifier includes a cascode transistor pair. The cascode transistor pair includes a first transistor and a second transistor. The power amplifier bias controller includes a current comparator, a saturation controller, and a RF attenuator. The current comparator is configured to compare a base current of the first transistor and a base current of the second transistor to obtain a comparison value. The saturation controller is configured to supply a reference signal to the RF attenuator based on the comparison value. The RF attenuator is configured to modify the amplitude of the RF input signal based at least in part on the reference signal.

In some embodiments, the RF attenuator can be a digital attenuator configured to modify the amplitude of the RF input signal based at least in part on a discrete attenuation value selected from a plurality of discrete attenuation values. Selection of the discrete attenuation value can be based at least in part on the reference signal.

In some embodiments, the RF attenuator can be an analog attenuator configured to modify the amplitude of the RF input signal based at least in part on an attenuation value. The attenuation value can be based at least in part on an analog voltage that is continuously modified until the reference signal indicates that the power amplifier is not operating in a saturated state.

In accordance with some implementations, the present disclosure relates to a power amplifier module including a power amplifier. The power amplifier includes a cascode transistor pair. The cascode transistor pair includes a first transistor and a second transistor. The power amplifier module includes a power amplifier bias controller. The power amplifier bias controller includes a current comparator configured to compare a first base current of the first transistor and a second base current of the second transistor to obtain a comparison value. The power amplifier module includes a saturation controller configured to supply a reference signal to a voltage converter based on the comparison value. The voltage converter is configured to modify a supply voltage provided to the power amplifier based at least in part on the reference signal.

In some embodiments, the first transistor can be a common base transistor and the second transistor can be a common emitter transistor. In some embodiments, the first transistor can be a common gate transistor and the second transistor can be a common source transistor.

In some embodiments, the voltage converter can increase the supply voltage in response to the reference signal indicating that the first transistor is operating in a saturation region.

In some embodiments, the voltage converter can include a switch mode boost converter.

In some embodiments, the saturation controller can be further configured to supply the reference signal to the voltage converter based on a second comparison value corresponding to a second power amplifier. In some embodiments, the voltage converter can be further configured to modify a supply voltage provided to the second power amplifier based at least in part on the reference signal.

In some embodiments, the saturation controller can further include a digital-to-analog converter and a ramp generator. The ramp generator can be configured to supply a count value to the digital-to-analog converter. The digital-to-analog converter can be configured to generate the reference signal based at least in part on the count value.

In some embodiments, the saturation controller can include a pull-down resistor in electrical communication with the power amplifier bias controller, a voltage input/output pin and a ramp clock generator. The ramp clock generator can be configured to detect whether the first transistor is operating in a saturation region based on a voltage across the pull-down resistor. The voltage can be based at least in part on the comparison value. The ramp clock generator can be configured to, in response to detecting that the first transistor is operating in the saturation region, cause the ramp generator to modify the count value.

In some embodiments, the digital-to-analog converter can be further configured to generate the reference signal based at least in part on an average power tracking value. The average power tracking value can be determined based on a target power signal received from a base station.

In some embodiments, the voltage converter can be configured to modify the supply voltage by boosting a battery voltage to a voltage level that exceeds the battery voltage. In some embodiments, supply voltage can be based at least in part on a battery voltage.

In accordance with some implementations, the present disclosure relates to a transceiver including a receiver, a voltage converter configured to modify a supply voltage provided to a power amplifier based at least in part on a reference signal, and a transmitter. The transmitter includes a power amplifier module, a power amplifier bias controller, and a saturation controller. The power amplifier module includes the power amplifier. The power amplifier includes a cascode transistor pair. The cascode transistor pair includes a first transistor and a second transistor. The power amplifier bias controller includes a current comparator configured to compare a first base current of the first transistor and a second base current of the second transistor to obtain a comparison value. The saturation controller is configured to supply the reference signal to the voltage converter based on the comparison value.

In some embodiments, the voltage converter can increase the supply voltage in response to the reference signal indicating that the first transistor is operating in a saturation region.

In some embodiments, the saturation controller can be further configured to supply the reference signal to the voltage converter based on a second comparison value corresponding to a second power amplifier. In some embodiments, the voltage converter can be further configured to modify a supply voltage provided to the second power amplifier based at least in part on the reference signal.

In some embodiments, the saturation controller can further include a digital-to-analog converter and a ramp generator. The ramp generator can be configured to supply a count value to the digital-to-analog converter. The digital-to-analog converter can be configured to generate the reference signal based at least in part on the count value.

In some embodiments, the saturation controller can include a pull-down resistor in electrical communication with the power amplifier bias controller, a voltage input/output pin, and a ramp clock generator. The ramp clock generator can be configured to detect whether the first transistor is operating in a saturation region based on a voltage across the pull-down resistor. The voltage can be based on the comparison value. The ramp block generator can be configured to, in response to detecting that the first transistor is operating in the saturation region, cause the ramp generator to modify the count value.

In some embodiments, the digital-to-analog converter can be further configured to generate the reference signal based at least in part on an average power tracking value. The average power tracking value can be determined based on a target power signal received from a base station.

In some embodiments, the voltage converter includes a switch mode boost converter.

In accordance with some implementations, the present disclosure relates to a wireless device including a battery providing a battery voltage to one or more components of the wireless device and a transmitter. The transmitter includes a power amplifier module, a power amplifier bias controller, and a saturation controller. The power amplifier module includes a power amplifier. The power amplifier includes a cascode transistor pair. The cascode transistor pair includes a first transistor and a second transistor. The power amplifier bias controller includes a current comparator configured to compare a first base current of the common base transistor and a second base current of the common emitter transistor to obtain a comparison value. The saturation controller is configured to supply a reference signal to a voltage converter based on the comparison value. The voltage converter is configured to modify a supply voltage provided to the power amplifier based at least in part on a reference signal. The supply voltage is based at least in part on the battery voltage.

In some embodiments, the wireless device can further include a non-volatile memory configured to store one or more average power tracking values corresponding to one or more target voltage values. The supply voltage can be based at least in part on an average power tracking value selected from the one or more average power tracking values. The average power tracking value can be selected based on a target voltage from the one or more target voltage values.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION OF SOME EMBODIMENTS

Figure 1A:
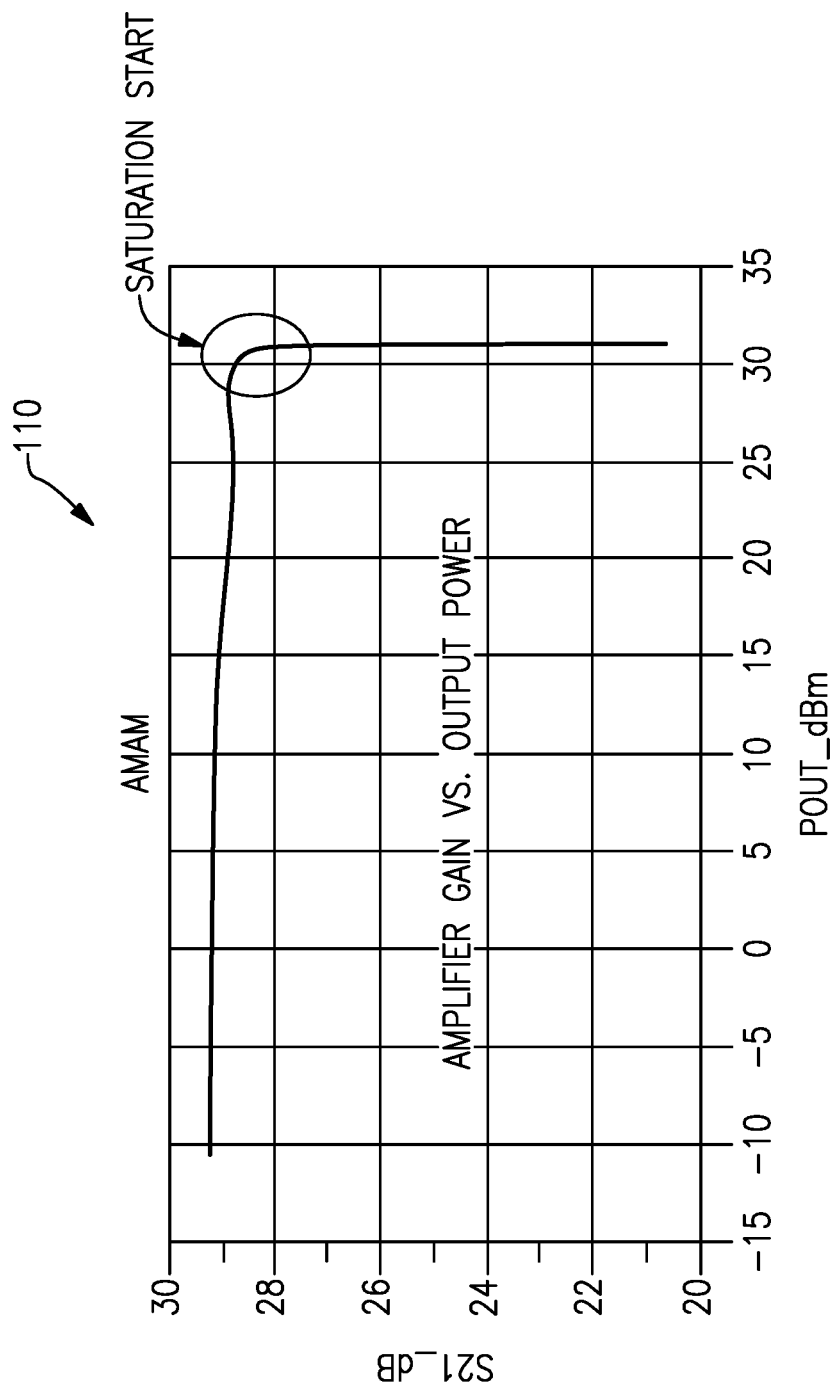
FIGS. 1A-1D illustrate graphs of simulations of an example power amplifier using a cascode configuration.

The headings provided herein, if any, are for convenience only and do not necessarily affect the scope or meaning of the claimed invention.

Introduction

Many wireless devices include one or more linear power amplifiers. In some cases, the power amplifier receives a modulated waveform or signal that includes amplitude modulated content. In order for the power amplifier to accurately amplify the received signal before transmission, it is desirable to avoid compression of the signal. When the power amplifier enters compression, the power amplifier output may no longer be linearly related to its input. Once the power amplifier starts to compress the signal and the device starts to enter a saturation mode, the modulated waveform may become distorted, which can result in information loss. Further the signal spectrum may change and start to degrade causing spectrum to spread into adjacent areas of the band and violate system specifications. The spreading of the spectrum into adjacent channels can interfere with other wireless devices thereby negatively impacting other wireless devices. This degradation may occur because a smaller version of the signal transmitted by the wireless device with the power amplifier (PA) that is in compression occurs in spectrum allocated to another wireless device. This inner-modulation component can be difficult to filter because it appears at a relatively small offset relative to the transmitted frequency. This offset is typically significantly closer to the carrier frequency than a harmonic.

Often, the power applied to the PA and the power compression point is a function of the supply voltage and the load impedance. Thus, with a fixed voltage supply and fixed load impedance, it is possible to determine the saturated power level of the PA and the compression characteristics of the PA. If the power amplifier is operating in a system where the load impedance changes because, for example, the antenna or the antenna's environment changes (e.g., position of a user's hand relative to the antenna), then the compression and saturation point of the PA can change. The power compression may result in the radio frequency (RF) signal being clipped. Thus, the maximum amplitude of the signal may be lost. Although it is often desirable to avoid compression, a PA is generally most efficient when operating near compression without degrading spectrum. Thus, the PA often has a narrow operating range.

To address the problem of power compression, it can be desirable to determine that a PA is operating in such a condition where the output spectrum is degraded. This can be challenging because the degraded signals can be approximately 30 db below a desired signal. One solution is to use an RF detector or a receiver. However, adding an RF detector or a receiver can add significant cost and may require a lot of current resulting in shorter battery life for a wireless device. Further, adding the additional components results in added complexity.

Embodiments herein can detect power compression by monitoring a Beta value (referred to herein as "Beta") for one or more transistors of the PA. Beta refers to a ratio between the collector current and the base current of the transistor. Generally, the collector current is much larger than the base current. Thus, Beta is often between 100 and 120 when the transistor is not in saturation. However, it should be understood that the Beta value for a transistor that is not in saturation may be both process and application specific. When Beta decreases, it can be determined that the transistor is in saturation. Often, the decrease in Beta will be relatively sharp, as illustrated for example with respect to FIG. 1C. When the PA is significantly compressed, Beta of the transistor may decrease to half of Beta in the non-compressed stated.

One solution for monitoring Beta is to monitor the collector current and monitor the base current for the one or more transistors and divide the two currents to obtain the current ratio, which would result in Beta. Monitoring the collector current may result in degrading or reducing the available power from the power supply available to the PA because components added to sense the collector current may reduce the available power. Thus, monitoring current can result in loss in the collector feed, which may result in the voltage presented to the collector of the PA transistor being reduced.

Figure 2:
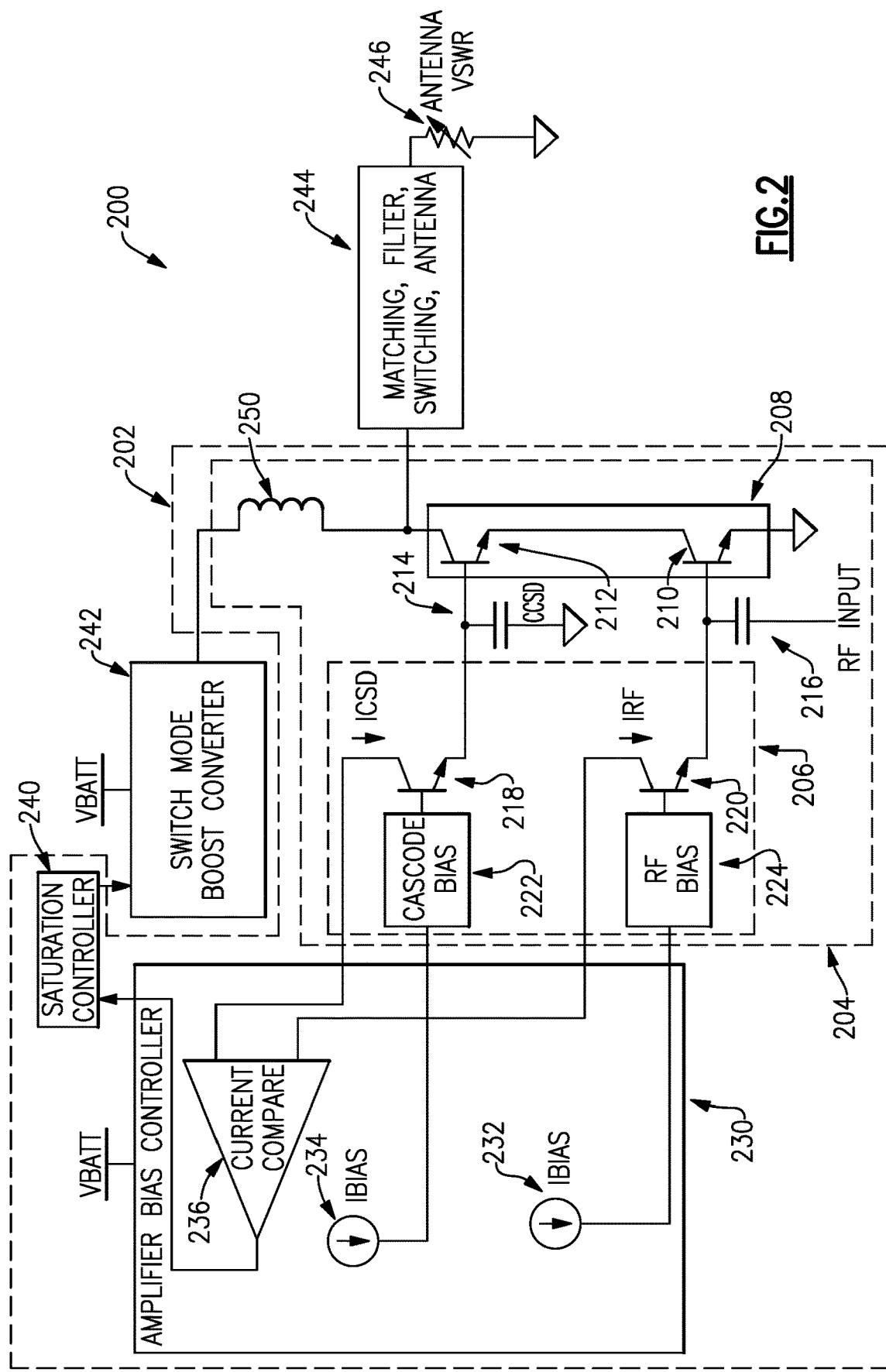
FIG. 2 illustrates a first example of a portion of a transceiver that includes a cascode power amplifier and a saturation controller.
Figure 5:
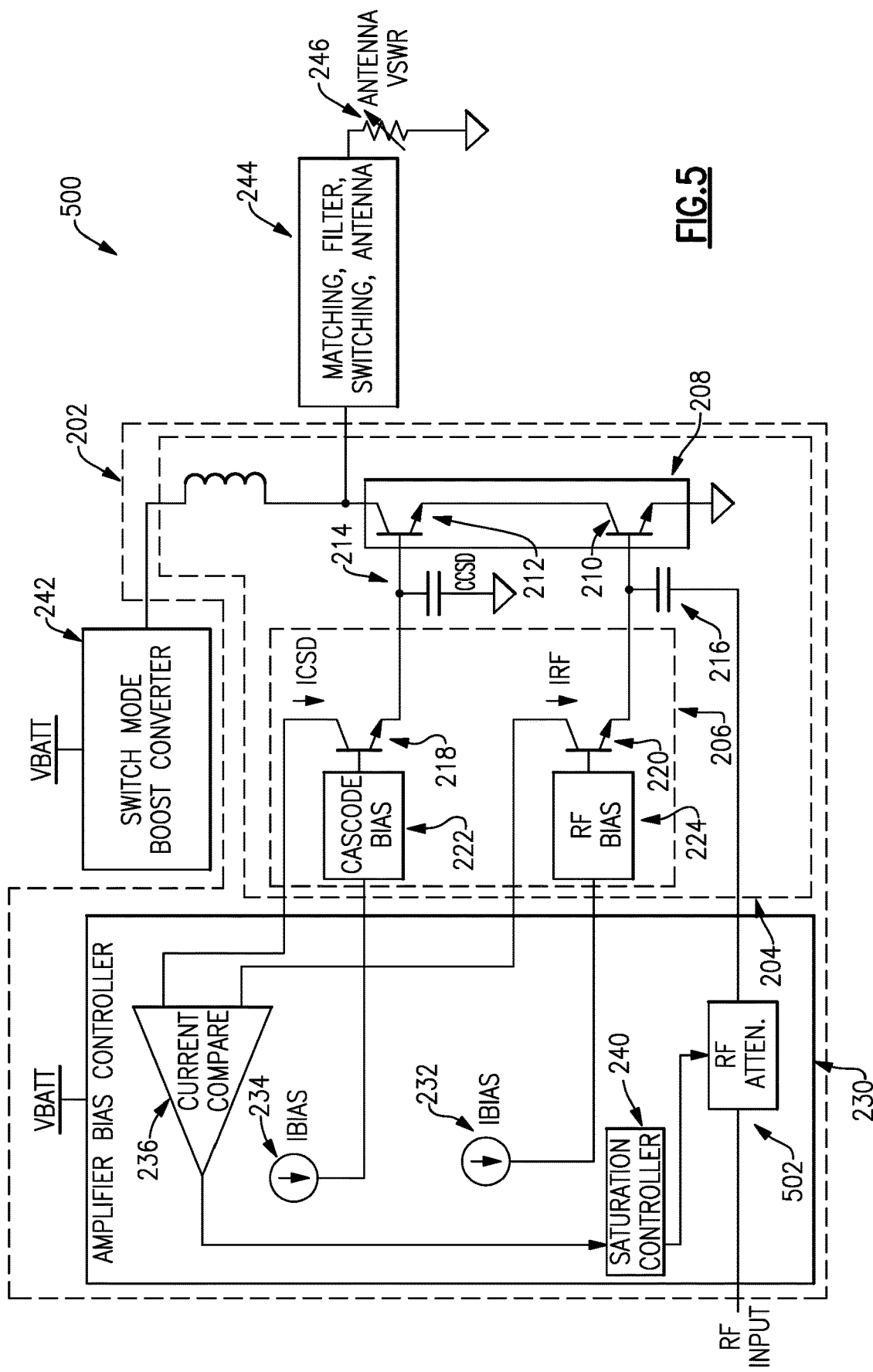
FIG. 5 illustrates a second example of a portion of a transceiver that includes a cascode power amplifier and a saturation controller.
Figure 6:
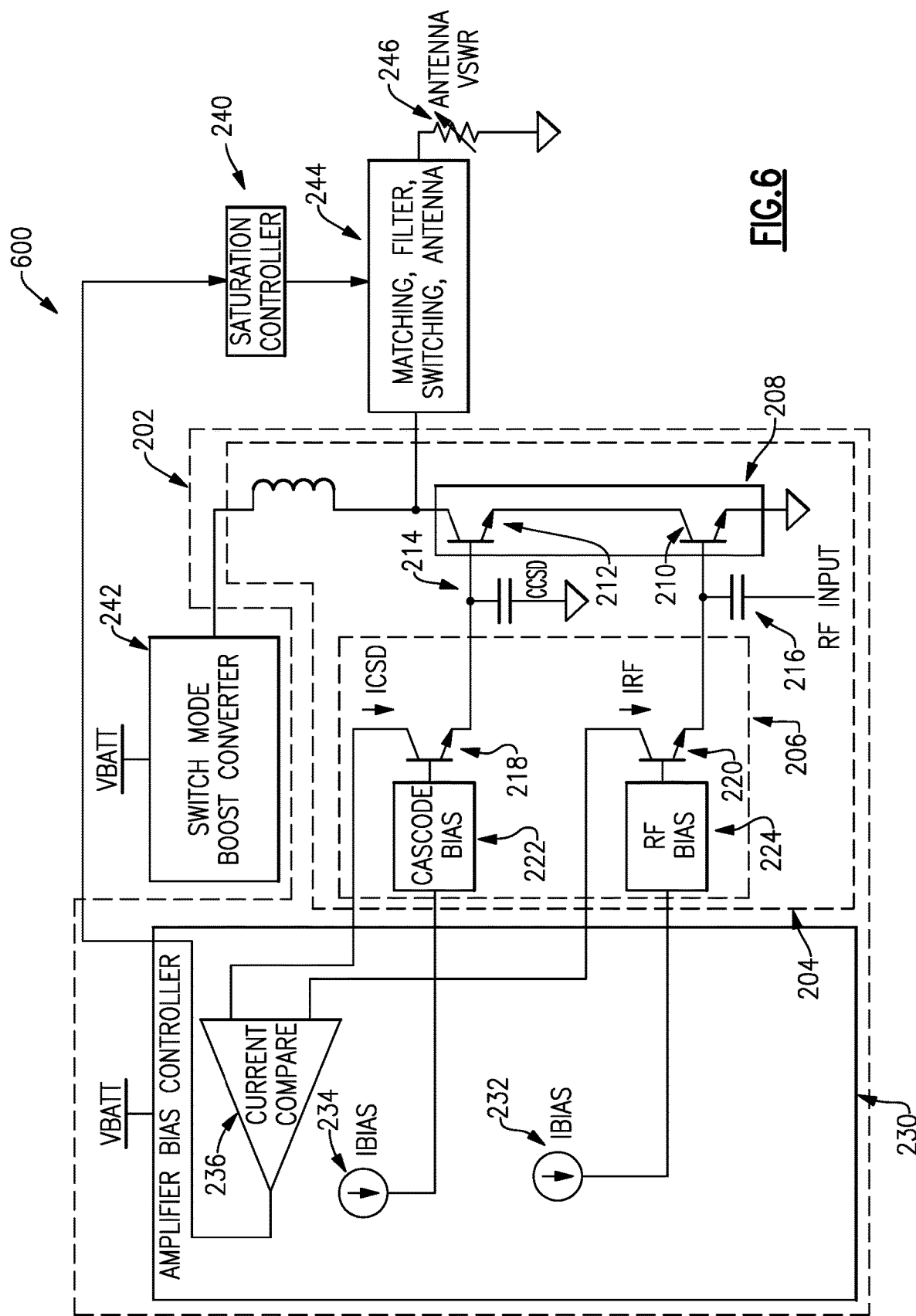
FIG. 6 illustrates a third example of a portion of a transceiver that includes a cascode power amplifier and a saturation controller.

Embodiments presented herein reduce the impact of monitoring collector current on the available power by taking advantage of a cascode transistor structure. FIGS. 2, 5, and 6, which are described in more detail below, present several examples of systems that include a PA with a cascode configuration that may be used with embodiments described herein.

Figure 1B:
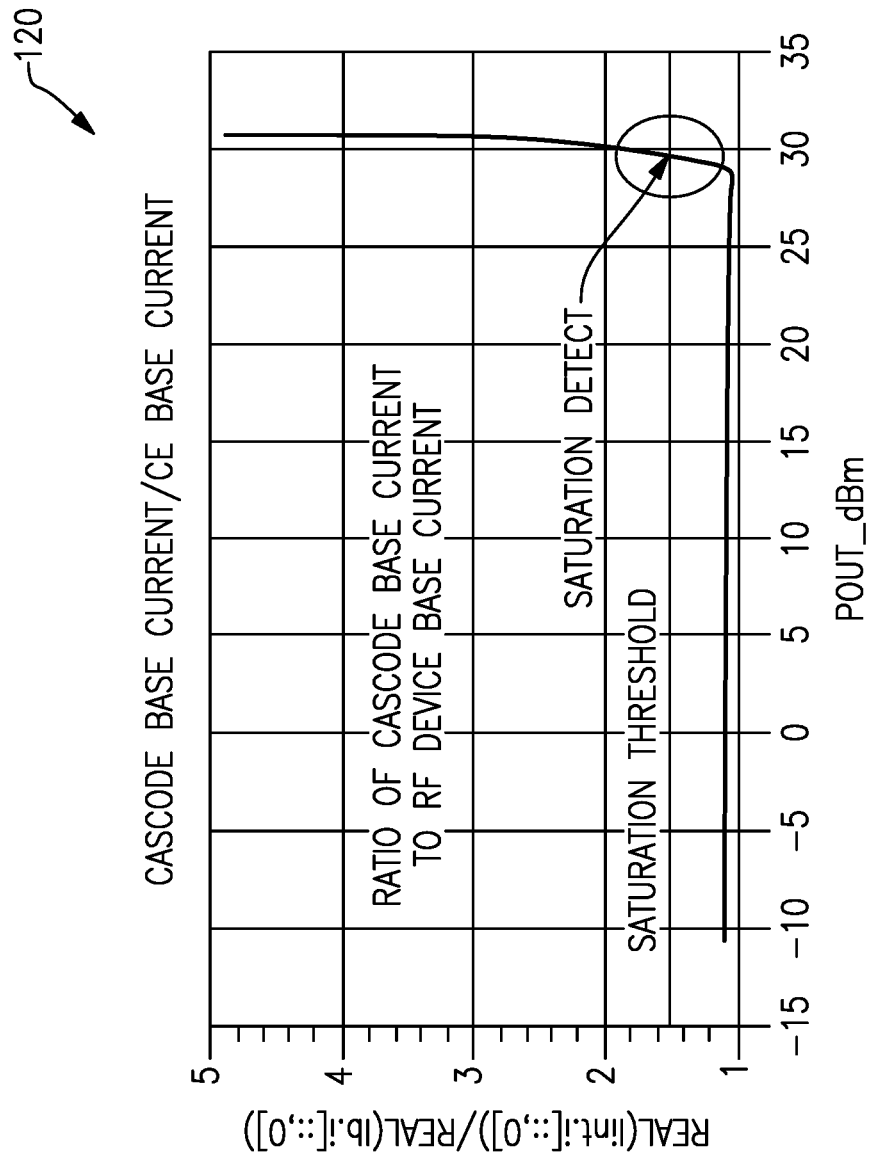
Figure 1C:
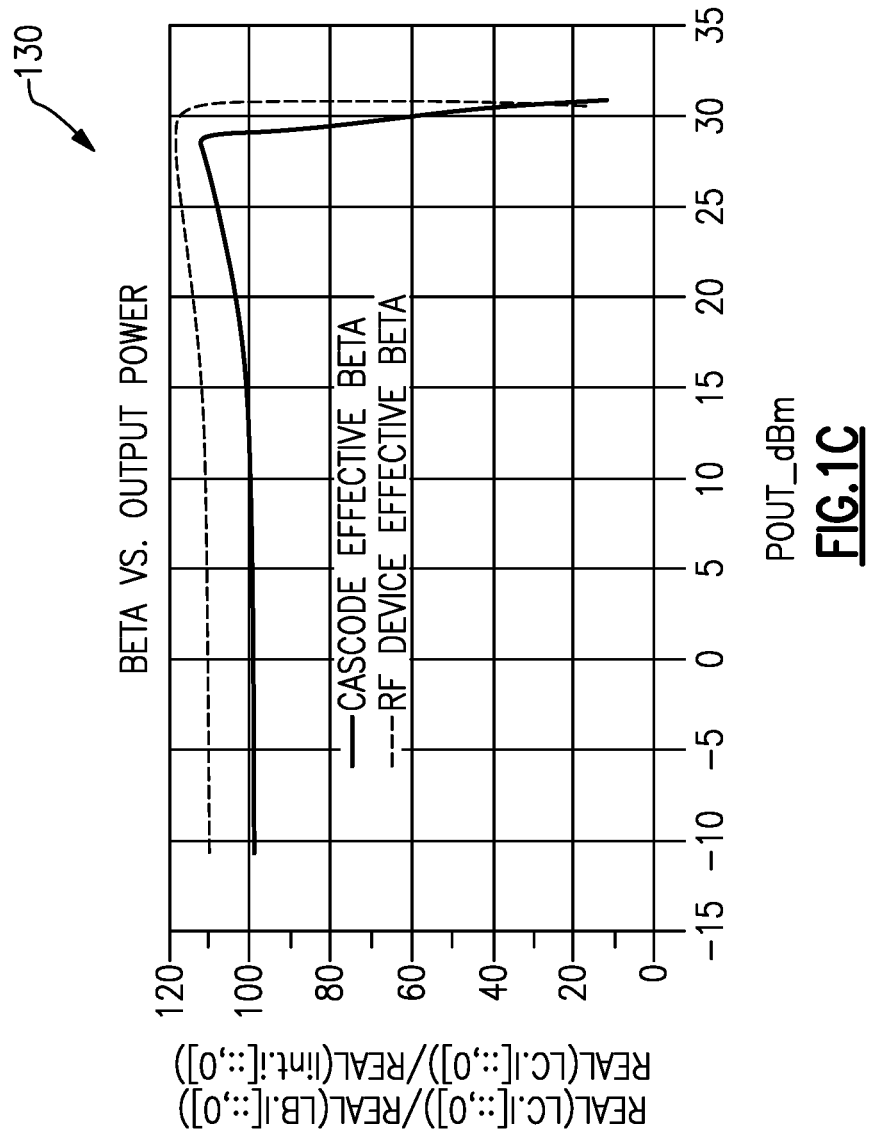
Figure 1D:
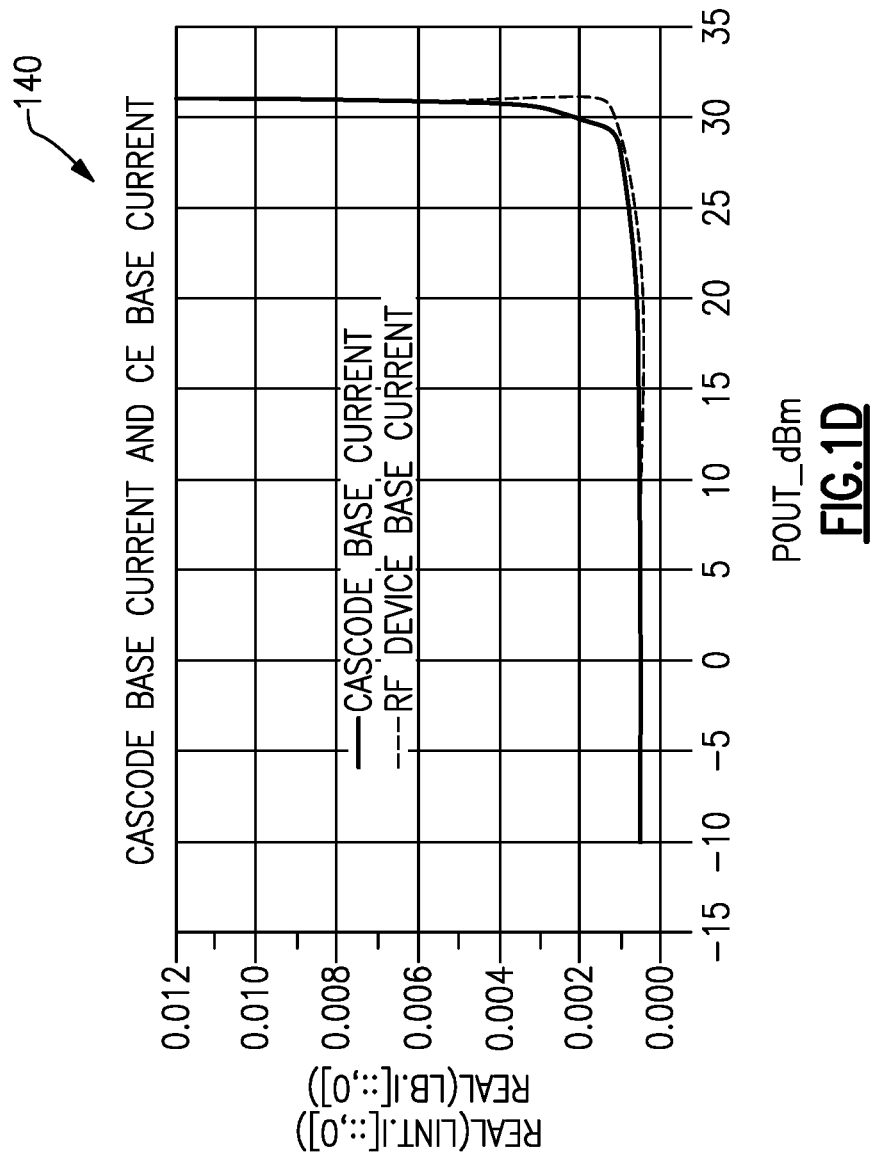

FIGS. 1A-1D illustrate graphs of simulations of a power amplifier using a cascode configuration that illustrates how Beta can be used to detect saturation of the power amplifier, or the transistors thereof. FIG. 1C is a graph 130 of Beta vs output power for the cascode transistor and for the RF device transistor of a PA that is designed with a cascode configuration. In this case, the cascode transistor may refer to the transistor that is in electrical communication, although not necessarily direct communication, with an antenna of a wireless device. Further, in this case, the RF device transistor may refer to the transistor that receives an RF input signal for transmission.

As illustrated by the graph 130 in FIG. 1C, as the output power starts to compress, or the gain starts to compress, Beta starts to gradually rise for each transistor before dropping off precipitously. However, as is clear from the graph 130, there is a 2 to 3 dB difference in the output power between the two transistors before the Beta decreases sharply. Thus, there is a significant difference in Beta when the cascode transistor first compresses or enters saturation.

Using embodiments disclosed herein, the saturation can be detected by comparing Beta of the cascode transistor and Beta of the RF device transistor of the PA. As previously mentioned, there can be a large discrepancy in Beta from one device to another device due to manufacturing process, among other things. Thus, by determining a relative difference between the Beta values of two transistors, instead of analyzing the Beta value of each transistor independently, embodiments presented herein may be process independent. In some cases, a difference in Beta of 20% may indicate saturation of the RF device transistor.

As illustrated by the graph 110 in FIG. 1A, the output power where the PA enters saturation is also roughly the point where the gain versus output power for the PA drops off. Further, as illustrated by the graph 140 in FIG. 1D, when the PA enters saturation, the output power remains constant as the current increases. However, as with Beta, there is a discrepancy between the base current of the cascode transistor and the RF device transistor. Thus, it is possible to compare the base currents of the transistors of a PA with a cascode configuration instead of comparing the Beta values. Advantageously, in certain embodiments, by comparing the base currents instead of the Beta values, the complexity of the hardware used to determine whether the PA is in saturation can be reduced and both cost and power savings can be achieved. Further, the graph 120 of FIG. 1B illustrates that the ratio of the base currents for the transistor pair that form the cascode PA can be used to identify the point at which the PA enters saturation.

Embodiments disclosed herein can determine that a power amplifier is in compression, or that a transistor of the power amplifier is operating in a saturated state, by analyzing the ratio of the base currents of a pair of transistors of the PA configured in a cascode design. The threshold for determining whether a transistor of the cascode transistor pair of the power amplifier is in saturation may be process and/or application specific. For example, the threshold may be 1.2, or a difference of 20%. In some implementations, the threshold may be set or adjustable based on user settings or an operating environment.

A number of implementations are possible for detecting whether the power amplifier is in compression and for taking the power amplifier out of compression. Several embodiments are described herein with respect to the remaining figures. Further, embodiments herein are described primarily with respect to a transmitter. However, it should be understood that some implementations of the systems described herein can be adapted for use with a receiver.

First Example Transceiver

FIG. 2 illustrates a first example of a portion of a transceiver 200 that includes a power amplifier module 202, which includes a cascode power amplifier 208 and a saturation controller 240. In some implementations, the transceiver 200 may be a transmitter. Generally, embodiments described herein are used with respect to transmitters. It is often not necessary to implement the embodiments described herein with respect to a receiver because the receiver is typically designed to support a maximum expected receive signal and the supported compression level with the receiver is generally much greater than with the transmitter. However, the dynamic range of the receiver may also result in a greater current drain. Thus, in some embodiments, embodiments described herein may be used with a receiver to reduce the dynamic range and to increase power savings. Accordingly, although embodiments described herein are generally described with respect to a transmitter, in some embodiments, the transceiver 200 may be a receiver. The cascode power amplifier 208 is a power amplifier with transistors 210 and 212 that are electrically connected in a cascode configuration. The cascode configuration stacks one transistor 212 above the other transistor 210 such that, in the case of bipolar junction transistors (BJTs), the emitter of the transistor 212 is in electrical communication with the collector of the transistor 210. It should be understood that the cascode power amplifier 208 may be a part of a power amplifier 204. For instance, the cascode power amplifier 208 may be a portion of the PA 204 that includes a pair of transistors in a cascode configuration.

The transistor 210 may be referred to as the RF device transistor or RF transistor and is configured to receive a RF input signal. The transistor 212 may be referred to as the cascode transistor and is configured to provide a reference current that can be used by the amplifier bias controller 230 and/or the saturation controller 240 to determine whether the transistor 210 is operating in a saturation mode. In some implementations, the transistors 210 and 212 are BJTs. In such cases, the transistor 210 may be a common emitter transistor and the transistor 212 may be a common base transistor. In other words, the transistor 210 may have its emitter in electrical communication with a common ground and the transistor 212 may have its base in electrical communication with the common ground (e.g., via a capacitor 214). Alternatively, the transistors 210 and 212 may be field effect transistors (FETs). In some such cases, the transistor 210 may be a common source transistor and the transistor 212 may be a common gate transistor.

As illustrated in FIG. 2, the cascode power amplifier 208 may be part of a power amplifier 204 that can include a number of additional devices. For example, the power amplifier 204 may include a bias circuit 206, a capacitor 216 in electrical communication with the base of the common emitter transistor 210, a capacitor 214 in electrical communication with the base of the common base transistor 212, and an inductor 250 in electrical communication with the collector of the common base transistor 212.

The capacitor 216 may be configured to prevent DC bias from leaking into the load on the RF input. Further, the capacitor 214 can function as a bypass capacitor configured to keep RF energy off of the node between the bias circuit 206 and the base of the common base transistor 212. The inductor 250 may be configured to supply a supply voltage to the cascode power amplifier 208. The supply voltage may be provided to the collector of the common base transistor 212.

The bias circuit 206 may include a circuit for providing a bias current to the cascode power amplifier 208. In some embodiments, as illustrated in FIG. 2, the bias circuit 206 is included as part of the power amplifier 204. However, in some other embodiments, the bias circuit 206 may be separate from the power amplifier 204. The bias circuit 204 may include a transistor 220 that may be configured to supply a voltage to the base of the common emitter transistor 210. The transistor 220 may act as a buffer and can supply the base current to the common emitter transistor 210. This base current may be based at least in part on a voltage generated by the RF bias block 224 that may be applied via the transistor 220 to the common emitter transistor 210. The voltage that may be generated by the RF bias block 224 may be based on a current bias block 232. This current bias block 232, which may be included as part of the power amplifier bias controller 230, may be a current source formed from a pair of diodes. In some cases, one of the diodes may be configured with a voltage that is equal to, or within a threshold difference of, a base-emitter voltage (Vbe) of the common emitter transistor 210. The other diode may have a voltage that is equal to, or within a threshold difference of, a Vbe of the bias transistor 220.

Further, the bias circuit 204 may include a transistor 218 and a cascode bias block 222, which are configured and function similarly to the transistor 220 and the RF bias block 224, respectively. In other words, the transistor 218 may be configured to supply a voltage to the base of the common base transistor 212. Further, the transistor 218 may act as a buffer and can supply the base current to the common base transistor 212. This base current may be based at least in part on a voltage generated by the cascode bias block 222 that can be applied via the transistor 218 to the common base transistor 212. The voltage that may be generated by the cascode bias block 222 may be based on a current bias block 234. Like the current bias block 232, the current bias block 234, which may be included as part of the power amplifier bias controller 230, may be a current source formed from a pair of diodes. In some cases, one of the diodes may be configured with a voltage that is equal to, or within a threshold difference of, a Vbe of the common base transistor 212. The other diode may have a voltage that is equal to, or within a threshold difference of, a Vbe of the bias transistor 218.

In addition to including the power amplifier 204, and in some cases, the bias circuit 206, which may be included in the power amplifier 204 or may be a separate system, the power amplifier module 202 may include a PA bias controller 230. As described above, the PA bias controller 230 may include a pair of current bias blocks 232 and 234 for providing bias currents to the RF bias block 224 and the cascode bias block 222, respectively. Further, the PA bias controller 230 may include a current comparator 236 that can compare the collector currents of the transistors 218 and 220.

With the cascode configuration of the cascode power amplifier 208, the current may flow, in some implementations, through the common base transistor 212, or the cascode device, from the collector to the emitter of the common base transistor 212. Further, the current may flow from the collector to the emitter of the lower device, or the common emitter transistor 210, which may be referred to as the RF transistor. Thus, in some implementations, the current flowing from the collector to the emitter may be identical or substantially the same (e.g., within a threshold current difference) for both transistors 210 and 212.

Advantageously, in certain embodiments, because the collector-emitter current (Ice) is the same for both transistors 210 and 212, saturation or compression of the common base transistor 212, or the cascode transistor, can be determined without calculating Beta, thereby enabling saturation or compression detection without the additional complexity of adding Beta detection and measurement devices.

As discussed previously, Beta is equal to the collector current divided by the base current. Further, the transistors 210 and 212 are configured to have the same Beta, or to at least each have a Beta within a threshold difference of each other. Thus, as Beta of the cascode power amplifier transistors 210 and 212 are equal and the collector current is equal, the base currents of the transistors 210 and 212 should be equal. Therefore, in some implementations, it is possible to detect when or if the common base transistor 212 enters saturation by comparing the base currents of the transistors 210 and 212 to determine if there is a discrepancy between the base currents of the transistors 210 and 212 that exceeds or satisfies a threshold discrepancy.

To compare the base currents of the transistors 210 and 212, the current comparator 236 may be provided with the base current of the transistor 212 and the base current of the transistor 210. The base currents of the transistors 210 and 212 may be the currents provided by the bias circuit 206. Thus, the current ICsd, which is the collector-emitter current (Ice) of the transistor 218, and which drives the base of the common base transistor 212, is the effective base current of the transistor 212. Further, the current IRF, which drives the base of the common emitter transistor 210 and is the Ice of the transistor 220, can serve as the effective base current of the transistor 210. By comparing the current ICsd and IRF using the current comparator 236, the PA bias controller 230 can determine whether the transistor 212 is saturated.

When the PA 204 is not in compression, the currents ICsd and IRF will be equal, or have no more than a threshold difference. As the PA drives into compression, ICsd will typically increase relative to IRF. In such cases, the current comparator 236 can detect the relative change in current and provide a signal to the saturation controller 240 indicating that the PA 204, or more specifically the cascode PA 208, is in compression. Typically, when the cascode PA 208 enters compression, the signal spectrum degrades, which results in a degradation of system performance. Advantageously, in certain embodiments, by using the ICsd and IRF currents to detect compression, compression detection can be simplified because elements or devices for measuring and comparing Beta can be omitted from the transceiver 200 and/or the PAM 202.

To determine whether the transistor 212 is operating in a saturated state, it is desirable to compare the current ICsd to a current that corresponds to a transistor that is not in saturation. Thus, in some embodiments, it is desirable to maintain the transistor 210 in a non-saturated state to serve as a reference for determining whether the transistor 212 is saturated. Generally, the voltage that is applied to the transistor 210 may be related to the voltage that is applied to the base of the common base transistor 212. In certain implementations, the voltage applied to the base of the common base transistor 212 is 1.2 volts higher than the voltage of the emitter. It should be understood that this voltage difference of 1.2 volts is process dependent and may vary in other implementations. However, assuming a process that results in a 1.2 volt difference between the base and emitter of the common base transistor 212, the voltage across the common emitter transistor 210 may be 1.2 volts lower than the voltage applied to the base of the common base transistor 212. Thus, assuming sufficient biasing is applied by the bias circuit 206 at the base of the transistor 212 such that the node at the base does not vary as a function of the received RF input or due to noise, it can be assumed that the voltage across the common emitter transistor 210 will not saturate, or at least will not saturate prior to detection of saturation of the common base transistor 212. Therefore, by selecting the voltage that is applied at the base of the transistor 212 and by selecting the capacitor 214, the transistor 210 can be prevented from saturating. In some embodiments, the transistor 210 may saturate at a higher power level than the transistor 212, thereby enabling detection of compression by using the transistor 212 as a reference prior to saturation by the transistor 212.

Upon determining that the power amplifier 204 has entered compression (e.g., that one of the transistors of the cascode PA 208 is in saturation) based at least in part on a comparison signal received from the current comparator 236, the saturation controller 240 can cause the supply voltage applied to the power amplifier 204 to be modified. For example, the saturation controller 240 can cause the power amplifier 204 to be taken out of a compression state by increasing the supply voltage applied to the power amplifier 204.

In some embodiments, the saturation controller 240 can increase the supply voltage by providing a reference signal to a boost converter, such as the switch mode boost converter 242. Based on the reference signal, the switch mode boost converter 242 can adjust the supply voltage applied to the power amplifier 204. The supplied DC voltage sets the headroom on the power amplifier 204. Thus, when the power amplifier 204 is in compression, the switch mode boost converter 242 triggers an increase in the DC supply voltage applied to the PA 204, which can take the PA 204 out of a compression state and can correct its spectrum. In certain embodiments, the boost converter 242 can be a buck converter. However, the boost converter 242 is not limited as such, and other voltage or current modification converters can be used with embodiments herein.

Although the saturation controller 240 is illustrated as an independent element of the PAM 202, other embodiments are possible. For example the saturation controller 240 may be part of the PA bias controller 230, the switch mode boost converter 242, or separate from the PAM 202. Further, in some cases, the saturation controller 240 may be separate from the transceiver 200. Similarly, although the switch mode boost converter 242 is illustrated as an independent element within the transceiver 200, other embodiments are possible. For example, the switch mode boost converter 242 may be integrated with the PA bias controller 230.

Figure 3:
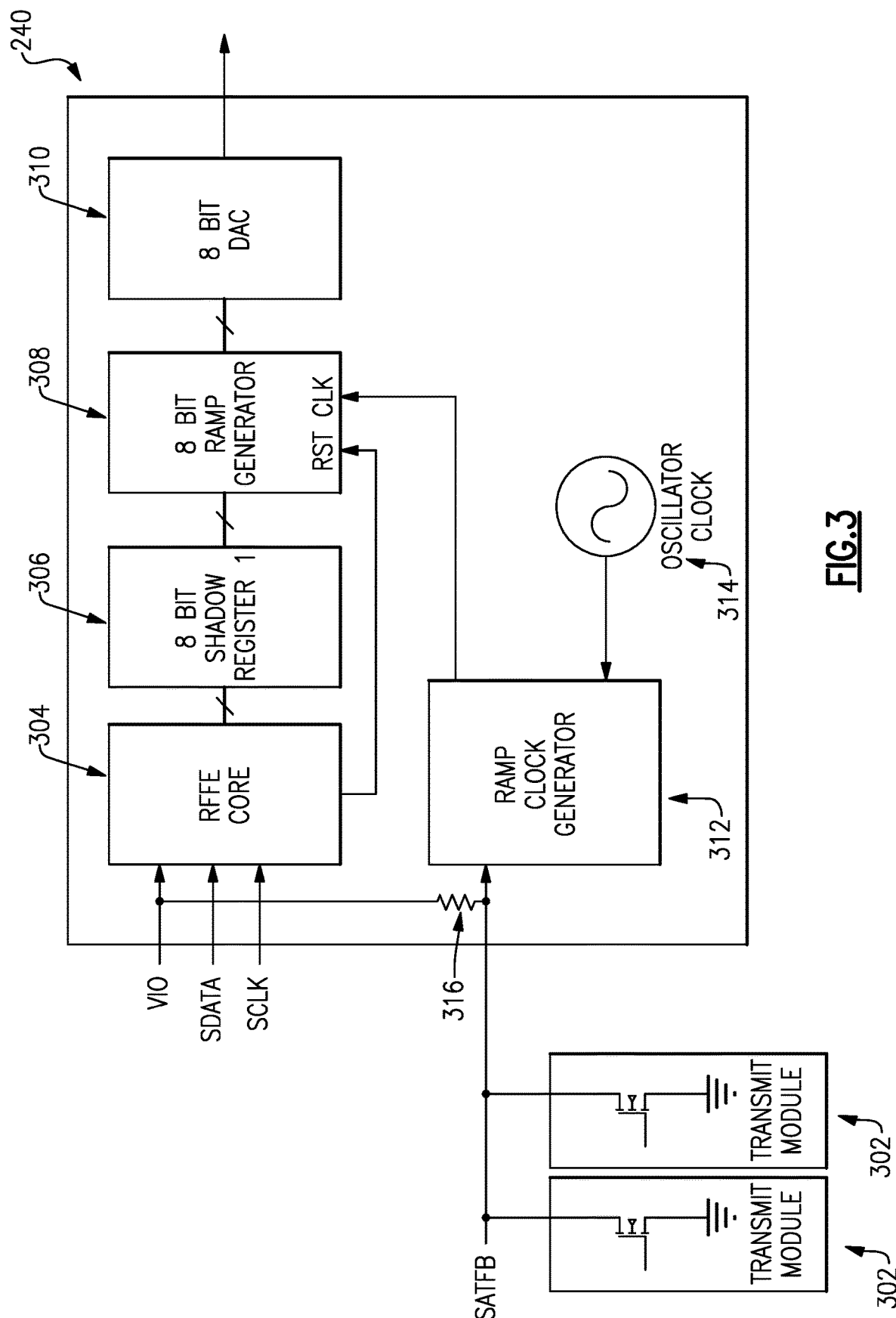
FIG. 3 illustrates an example of a saturation controller that can be used to prevent saturation of a cascode power amplifier.

The saturation controller 240 is described in more detail with respect to FIG. 3. Further, as described in more detail with respect to FIGS. 5 and 6, in some embodiments, the saturation controller may cause the power amplifier 204 to be taken out of a compression state using alternative or additional compression control processes.

The transceiver 200 may transmit a signal based on the RF input signal via the antenna 246. Further, in some embodiments, one or more impedance matching, filter, and/or switching elements included in block 244 may be in electrical communication between the antenna 246 and the power amplifier 204. As is described in more detail below, in some embodiments, the saturation controller 240 can take the power amplifier 204 out of a state of compression by controlling an impedance matching network included in block 244 to modify a load applied to the power amplifier 204.

In certain embodiments, each of the devices and/or circuits of the transceiver 200 may be implemented using a common process or on the same device. However, in other embodiments, portions of the transceiver 200 may be implemented using different processes. For example, the amplifier bias controller 230 may be implemented on a silicon die, while the power amplifier 204 may be implemented using a difference material, such as gallium arsenide (GaAs).

Example Saturation Controller

FIG. 3 illustrates an example of a saturation controller 240 that may be used to prevent saturation of a cascode power amplifier 208. As previously described with respect to FIG. 2, the saturation controller 240 may receive a signal based on a comparison of currents from the cascode power amplifier 208. This signal may be received from the current comparator 236. This received signal may be received at the saturation feedback (SATFB) pin. Further, the saturation controller 240 may output a reference signal that can be used by the switch mode boost converter 242 to adjust a voltage supplied to the cascode power amplifier 208.

The saturation controller 208 can include a radio frequency front end (RFFE) core 304, an 8 bit shadow register 306, an 8 bit ramp generator 308, an 8 bit digital to analog converter (DAC) 310, a ramp clock generator 312 and an oscillator clock 314. Further, the saturation controller 208 may include a pull down resistor 316 that facilitates determining whether one or more transistors 302 are in compression.

The RFFE core 304 can include an RFFE core that satisfies the MIPI® Specification from the MIPI® Alliance. The RFFE core 304 receives a target voltage value for the PA 204 via a serial data (SData) pin, which is clocked in via the serial clock (SClk). Alternatively, the RFFE core 304 receives a default value representative of the target voltage value. The target voltage, or the corresponding default value, may be identified by accessing an average power table stored in a memory. Further, the target voltage may be selected based on a target power level. This target power level may be specified by a base station that is in communication with a wireless device that includes the transceiver 200.

Once the RFFE core 304 receives the target voltage via the SData pin, the RFFE core 304 can convert the serial data into parallel data as an 8-bit word, which can be stored in the 8-bit shadow register 306. Although described as an 8-bit word, other data sizes are possible. Further, the 8-bit devices may be of other sizes. For example, the shadow register may be a 16-bit shadow register configured to store a 16-bit word or two 8-bit words.

The word stored in the 8-bit shadow register 306 can be used as an initial or default state for an 8-bit counter. This 8-bit counter can be maintained by the 8-bit ramp generator 308. The 8-bit counter may be driven by a clock signal received from the ramp clock generator 312 that bases its clock signal on the oscillator clock 314 and the signal provided by the current comparator 236 (e.g., the SATFB signal). Advantageously, the 8-bit shadow register 306 enables the saturation controller to store data, e.g., an initial counter value corresponding to a target voltage value, while new data may be received at the RFFE core 304 via the serial interface SDATA. Thus, in some cases, the saturation controller 240 can control the transition timing between a previous target voltage value and a new target voltage value preventing a time period without an initial counter value during a transition period.

In certain embodiments, the saturation controller 240 may be shared among multiple PAs, transmitters, or transceivers as illustrated by the multiple transmit modules 302 in electrical communication with the SATFB line. Each of the transmit modules 302 may be configured similarly to the transceiver 200 described with respect to FIG. 2. The saturation controller 240 can include a VIO pin, which may be a 1-pin interface that receives a digital logic high signal. If a power amplifier of any of the transmit modules 302 goes into saturation, the signal received across the SATFB can pull down resulting in a voltage across the resistor 316 causing a current to flow across the resistor and indicating to the ramp clock generator 312 that a PA is in saturation.

When the ramp clock generator 312 receives a signal indicating that a PA is in saturation, it can increment the ramp generator 308 one bit at a time by providing a clock signal to the ramp generator 308. In some such cases, the ramp generator 308 serves as a counter that counts based on the clock signal from the ramp clock generator 312 and the initial value provided by the shadow register 306. The incremented count value, in some cases, serves as the word, or data, that drives the DAC 310. The DAC 310 can convert the digital counter value to an analog signal, which may be provided to a boost converter 242 to drive or modify the voltage supply provided to the PA in saturation. Thus, in some cases, the DAC 310 may output a reference signal that can be provided to a boost converter (e.g., the boost converter 242), which can translate the reference signal into a voltage that may be applied to the collector of the transistor 212. This applied voltage may be referred to as a boost voltage and can be used to increase the voltage range on the power amplifier 204, thereby reducing or eliminating compression.

Alternatively, or in addition, the reference signal output by the DAC 310 may be used to modify an amplitude of the RF input signal and/or the load applied to the PA as will be described further with respect to FIGS. 5 and 6. In some cases, when SATFB pulls low, the ramp generator 308 starts incrementing one bit at a time, which can result in incrementing the supply voltage to the power amplifier. An example timing diagram for adjusting the supply voltage is described below with respect to FIG. 8.

As described above, the initial count value corresponding to a boost level may be incremented when the PA 204 enters a compression state or has a transistor in saturation. Once the PA 204 is taken out of compression, the boost state may be maintained. However, in some cases, the boost level may no longer be necessary because, for example, the wireless device has moved closer to the base station or the Voltage Standing Wave Ratio (VSWR) conditions have changed. In some such cases, it may be determined that there is a threshold amount of voltage headroom beyond the voltage level of a signal to be transmitted. In other words, in some cases, the voltage level of the signal may be more than a threshold level lower than a maximum available voltage level enabled by the boost. In such cases, the saturation controller 240 may reset the counter for the boost value by providing a reset signal to the ramp generator 308, thereby reducing the boost voltage. Moreover, in some such cases, a new default or initial value may be received at the RFFE core 304 corresponding to a new target voltage.

Example Wireless Device

Figure 4:
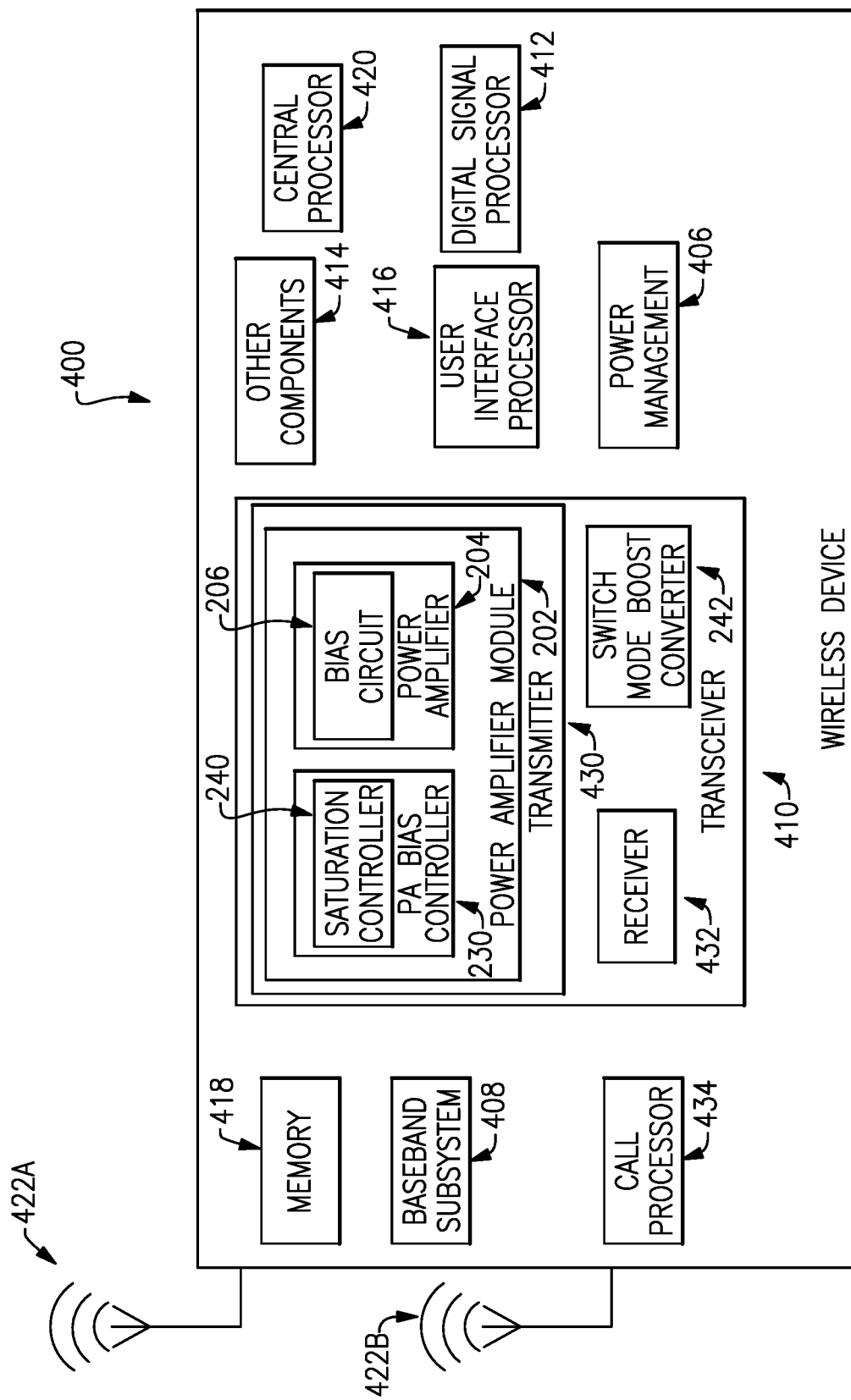
FIG. 4 illustrates an example of a wireless device that includes a power amplifier module.

FIG. 4 illustrates an example of a wireless device 400 that may include a power amplifier module 202 with a power amplifier 204 that includes a pair of cascode configured transistors (e.g., the cascode power amplifier 208). Although the wireless device 400 illustrates only one power amplifier module (PAM), it is possible for the wireless device 400 to include a number of PAMs, each of which may or may not be of the same configuration as PAM 202. It should be understood that the wireless device 400 is but one non-limiting example of a wireless device and that other embodiments of the wireless device 400 are possible.

The power amplifier module 202 can include a number of elements. These elements may include, for example, a power amplifier 204 and a PA bias controller 230. Each of these power amplifier module elements may be implemented on the same circuit die. Alternatively, at least some of the elements of the power amplifier module 202 may be implemented on a different element circuit die. Advantageously, by implementing elements on a different circuit die, different semiconductor technologies may be used for different circuit elements of the power amplifier module 202. For example, the PA 204 may be implemented using gallium arsenide (GaAs) technology while the PA bias controller 230 may be implemented using silicon (Si).

As illustrated, the PA 204 may include a bias circuit 206 and the PA bias controller 230 may include a saturation controller 240. Alternatively, one or more of the bias circuit 206 and the saturation controller 240 may be separate elements included in the PAM 202. Further, although the PAM 202 is depicted as including a single PA 204, in some embodiments, the PAM 202 may include multiple PAs 204. Further, the PAM 202 may include a switching circuit, such as described with respect to the block 244 of FIG. 2, which may be used to select a signal from among the plurality of PAs. The PAM 202 can facilitate, for example, multi-band operation of the wireless device 400. The mode of the PAM 202 may, in some cases, be set by a power amplifier controller (not shown) based on a signal and/or mode selection set by the controller.

In some embodiments, the PA bias controller 230 may set the operating point for the PA 204 by modifying the bias circuit 206. For instance, the PA bias controller 230 may set or modify a bias current provided by the bias circuit 206 to the PA 204.

The power amplifier 204 may include any type of power amplifier. However, generally, the PA 204 includes a PA with a cascode transistor configuration as illustrated with respect to FIG. 2. Further, the PA 204 may be set to operate at a particular operating point. This operating point may be configured by the bias circuit 206, which may provide a bias current and/or voltage to the power amplifier 204.

In some cases, the PAM 202 can receive RF signals from a transceiver 410 that can be configured and operated in known manners to generate RF signals to be amplified and transmitted, and to process received signals. In some implementations, the PAM 202 is included as part of a transmitter 430, which may be included in the transceiver 410. In some such cases, the PAM 202 may process signals for transmission without processing received signals. In other implementations, the PAM 202 may process both received signals and signals for transmission to, for example, a base station.

The transceiver may further include a receiver 432 and a switch mode boost converter 242. The receiver 432 may include a separate PAM, or may share the PAM 202 with the transmitter 430. The switch mode boost converter 242 may provide a boost voltage to the PAM 202. In some cases, the switch mode boost converter is included as part of the transmitter 430 and/or the PAM 202.

The transceiver 410 may interact with a baseband sub-system 408 that is configured to provide conversion between data and/or voice signals suitable for processing by one or more user interface elements and RF signals suitable for processing by the transceiver 410. The transceiver 410 may also be electrically connected to a power management component 406 that is configured to manage power for the operation of the wireless device. Such power management can also control operations of the baseband sub-system 408 and the PAM 202. Further, the power management component 406 may provide a supply voltage to the switch mode boost converter 242, which may boost the voltage before providing the voltage to the PA 204. It should also be understood that the power management component 406 may include a power supply, such as a battery. Alternatively, or in addition, one or more batteries may be separate components within the wireless device 400.

A number of connections between the various components of the wireless device 400 are possible, and are omitted from FIG. 4 for clarity of illustration only and not to limit the disclosure. For example, the power management component 406 may be electrically connected to the baseband subsystem 408, the PAM 202, the DSP 412, or other components 414. As a second example, the baseband subsystem 408 may be connected to a user interface processor 416 that may facilitate input and output of voice and/or data provided to and/or received from the user.

The baseband sub-system 408 can also be connected to a memory 418 that may be configured to store data and/or instructions to facilitate the operation of the wireless device 400, and/or to provide storage of information for the user. Further, in some embodiments, the memory 418 may include an average power tracking (APT) table, or other data structure. The APT table can identify target voltage levels for the PA 204 that correspond to target power levels, which may be identified by a base station. For example, upon receipt of a target power level from a base station, the wireless device may access the APT table to determine a corresponding target voltage level. This target voltage level may be used to set an operating point for the PA 204.

In some embodiments, the call processor 434 may be in communication with the base station. This call processor 434 may interpret commands from the base station and may access the APT table based on a command received from the base station. Further, the call processor 434 may instruct the PAM 202 to adjust the operating point of the PA 204 by providing the target voltage to a RFFE core of the saturation controller 240, which may in turn adjust the voltage of the PA 204 by, for example, causing the boost converter 242 to boost the power supply voltage to the target voltage level identified in the APT table as corresponding to the target power level specified by the base station. An example of adjusting the voltage level for the PA 204 is described in more detail below with respect to the timing example of FIG. 8.

In addition to the aforementioned components, the wireless device may include one or more central processors 420. Each central processor 420 may include one or more processor cores. Further, the wireless device 400 may include one or more antennas 422A, 422B. In some cases, one or more of the antennas of the wireless device 400 may be configured to transmit and/or receive at different frequencies or within different frequency ranges. Further, one or more of the antennas may be configured to work with different wireless networks. Thus, for example, the antenna 422A may be configured to transmit and receive signals over a 2G network, and the antenna 422B may be configured to transmit and receive signals over a 3G network. In some cases, the antennas 422A and 422B may both be configured to transmit and receive signals over, for example, a 2.5G network, but at different frequencies.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. Further, the wireless device 400 may include any number of additional components, such as analog to digital converters, digital to analog converters, graphics processing units, solid state drives, etc. Moreover, the wireless device 400 can include any type of device that may communicate over one or more wireless networks and that may include a PA 204 and/or PAM 202. For example, the wireless device 400 may be a cellular phone, including a smartphone or a dumbphone, a tablet, a laptop, a video game device, a smart appliance, etc.

Second Example Transceiver

FIG. 5 illustrates a second example of a portion of a transceiver 500 that includes a power amplifier module 202, which includes a cascode power amplifier 208 and a saturation controller 240. In some embodiments, the transceiver 500 may be a transmitter. As illustrated by the re-use of reference numerals, the transceiver 500 may include a number of the elements of the transceiver 200. Further, elements of the transceiver 500 that share a reference numeral with elements of the transceiver 200 may include some or all of the embodiments described with respect to the transceiver 200. Thus, to simplify discussion, descriptions of elements of transceiver 500 that are similar to elements of the transceiver 200 will not be repeated.

The transceiver 500 of FIG. 5 can identify whether the PA 204 is in compression in a similar manner as the transceiver 200 by comparing the ICsd and IRF currents using the current comparator 236. However, rather than changing the supply voltage to increase voltage headroom of the PA 204 to take the PA 204 out of compression, the saturation controller 240 can use the output of the current comparator 236 to reduce the RF input signal provided to the PA 204 by use of an RF attenuator 502. By reducing the RF input signal supplied to the PA 204, the output signal from the PA 204 is effectively reduced. If the output signal is reduced sufficiently, the PA 204 can be taken out of a compression operating state. Reducing the RF input signal may include reducing the amplitude of the RF input signal.

In some cases, it is not desirable to reduce the RF input waveform because the signal provided to the transceiver 500 is reduced, which can result in degraded performance. Using the transceiver 200 with the wireless device 400 may result in improved performance for the wireless device 400; however, other wireless devices in communication with the same base station as the wireless device 400 may have degraded performance because the wireless device 400 is outputting a more powerful signal, which may result in greater distortion for other wireless devices. Using the transceiver 500 may improve the performance of other wireless devices by reducing distortion, but may result in lower performance for the wireless device 400 due to the reduction in the RF input signal. Thus, in some cases, the transceiver 200 may be preferable when the wireless device 400 is farther from the base station and the transceiver 500 may be preferable when the wireless device 400 is closer to the base station. Advantageously, in certain embodiments, the systems of FIG. 2 and FIG. 5 can be combined. In other words, the wireless device 400 may increase the supply voltage and/or reduced the RF input signal based on operating conditions. Moreover, in some cases, the base station may provide a command to the wireless device 400 to control whether the voltage supply and/or the RF input signal provided to the PA 204 is modified.

As illustrated in FIG. 5, the RF attenuator of the transceiver 500 may be included as part of the PA bias controller 230. Alternatively, the RF attenuator 502 may be a separate element or included as part of the PA 204. This RF attenuator 502 may be configured to receive the RF input signal and to attenuate the signal before it is provided to the power amplifier 204. Generally, the RF input signal is a fixed signal. Further, it is generally desirable that the PA 204 not change the signal to prevent data loss. Thus, use of the RF attenuator 502 enables the fixed-input waveform to be provided to the PA 204, but with a lower amplitude, thereby reducing the occurrence of compression.

The RF attenuator 502 may be either a digital attenuator or an analog attenuator. In some embodiments where the RF attenuator 502 is a digital attenuator, the RF attenuator 502 may include a number of discrete voltage levels. When the current comparator 236 detects saturation in the PA 204, the saturation controller 240 can increment the attenuator value and thereby decrease the RF input signal. In some cases, the attenuator value may be incremented iteratively based on the discrete voltage levels until the PA 204 is no longer operating in a state of compression.

In some embodiments where the RF attenuator 502 is an analog attenuator, an analog voltage sets the attenuation value. As saturation is detected, the voltage is adjusted, either ramped up or down depending upon the polarity of the attenuator, such that the attenuation increases until the power into the PA 204 drops to remove the PA 204 from a state of compression. In other words, using the RF attenuator 502, the saturation controller 240 may increase the attenuation at a fixed rate until compression is eliminated in the PA 204. Once the current comparator 236 indicates that the PA 204 is no longer in compression, the attenuation value may be held constant.

The RF attenuator 502 may include any type of circuit that can attenuate the RF input signal while maintaining a constant impedance based at least in part on a reference signal received from the saturation controller 240. In some embodiments, the RF attenuator 502 may include a Pi-network and/or a T-network.

Third Example Transceiver

FIG. 6 illustrates a third example of a portion of a transceiver 600 that includes a power amplifier module 202, which includes a cascode power amplifier 208 and a saturation controller 240. In some embodiments, the transceiver 600 may be a transmitter. As illustrated by the re-use of reference numerals, the transceiver 600, like the transceiver 500, may include a number of the elements of the transceiver 200. Further, elements of the transceiver 600 that share a reference numeral with elements of the transceiver 200 may include some or all of the embodiments described with respect to the transceiver 200. Thus, to simplify discussion, descriptions of elements of transceiver 600 that are similar to elements of the transceiver 200 will not be repeated.

The transceiver 600 of FIG. 6 can identify whether the PA 204 is in compression in a similar manner as the transceivers 200 and 500 by comparing the ICsd and IRF currents using the current comparator 236. However, instead of adjusting the supply voltage or attenuating the RF input signal, the transceiver 600 can modify the load at the output of the PA 204. In certain embodiments, the block 244 can include an impedance matching network that can be controlled by the saturation controller 240. In such embodiments, the saturation controller 240 can provide a reference signal to the impedance matching network of the block 244 to modify the impedance at the output of the PA 204. For example, the saturation controller 240 can cause one or more switches in a switch capacitor based impedance matching network to be opened or closed to modify the load at the output of the PA 204. In certain embodiments, by modifying the impedance load on the output of the PA 204, the PA 204 can be taken out of compression.

As mentioned above, an impedance matching network may be electrically connected between the PA 204 and the antenna 246, and/or one or more additional devices. A variety of impedance matching networks may be utilized by the block 244. Examples of embodiments of an adjustable automatic impedance matching network that may be used herein are described in U.S. Provisional Application No. 62/057,451, filed on Sep. 30, 2014 and titled AUTOMATIC IMPEDANCE MATCHING USING TRUE POWER INFORMATION, the entire disclosure of which is hereby incorporated by reference herein. Further, other adjustable load circuits may be utilized herein to modify the load of the PA 204.

In some embodiments, the load of the PA 204 and the voltage supply of the PA 204 may be modified in conjunction to remove the PA 204 from a compression state. In such embodiments, the saturation controller 240 may provide a reference signal to both the switch mode boost converter 242 and an impedance matching network of the block 244. Further, in some embodiments, the saturation controller 240 may be configured to adjust one or more of the voltage supply, the load of the PA 204, and an attenuation of the RF signal. Thus, in some implementations, the saturation controller 240, and/or a base station, may use a combination of techniques to prevent compression by the PA 204. In some embodiments, the selection of compression avoidance techniques may vary based on an operating environment for the wireless device. For instance, in cases where the RF input signal is strong or have a power above a threshold, the saturation controller 240 may attenuate the RF input signal, but in cases where the power of the RF input signal is below a threshold, the saturation controller may adjust the voltage supply provided to the PA 204 and/or the load of the PA 204. As another example, in cases where the base station determines that a number of wireless devices in a particular geographic area are below a threshold, the base station may cause the wireless device to modify the voltage supply to prevent compression.

Example Saturation Detection and Compensation Process

Figure 7:
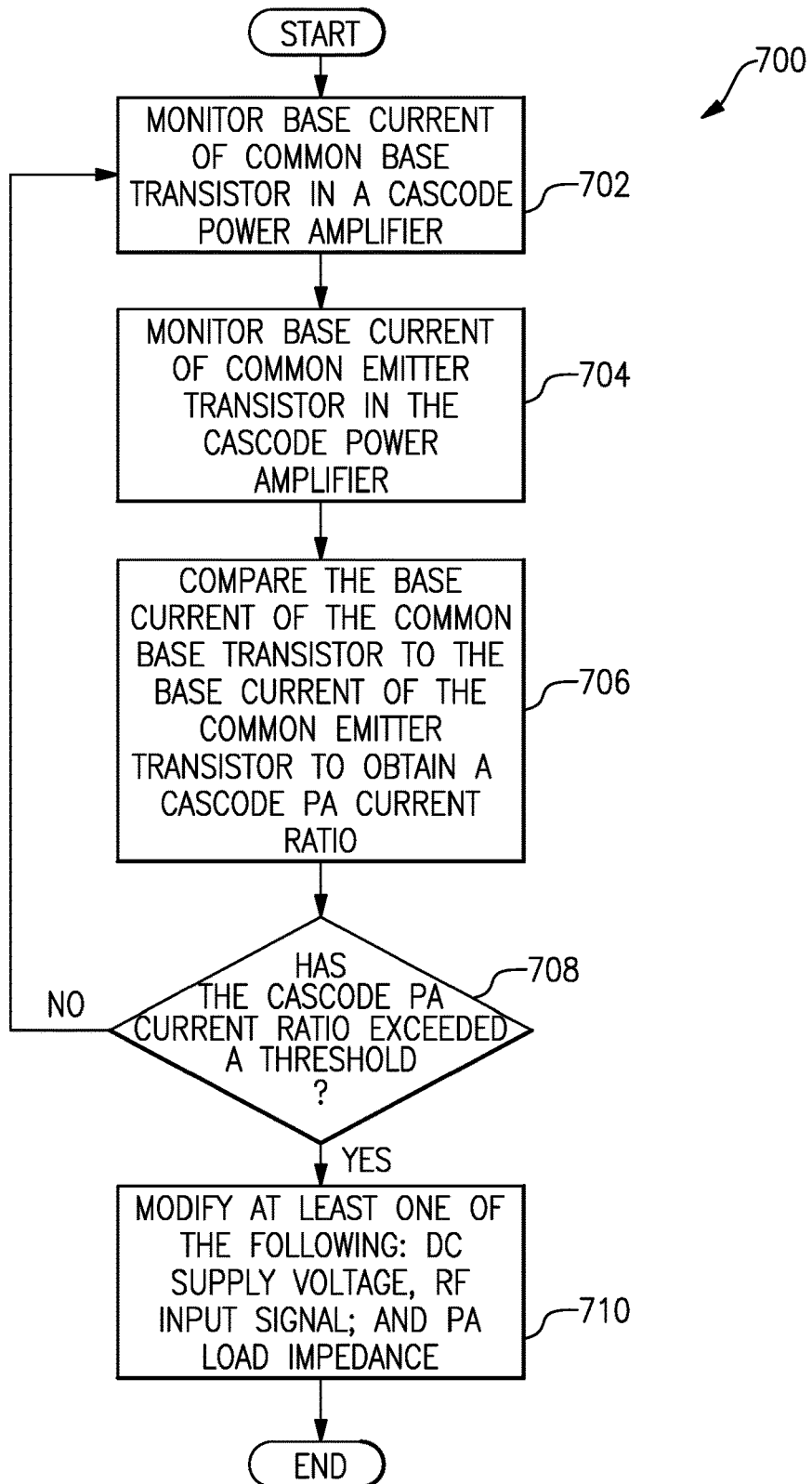
FIG. 7 illustrates a flowchart of an embodiment of a saturation detection and compensation process.

FIG. 7 presents a flowchart of an embodiment of a saturation detection and compensation process 700. The process 700 can be implemented by one or more elements that can detect a power amplifier that is in a state of saturation causing compression of an RF input signal and that can modify one or more operating conditions of the system to prevent the power amplifier from being in the state of saturation. For example, the process 700, in whole or in part, can be implemented by a power amplifier bias controller 230, a saturation controller 240, a switch mode boost converter 242, an RF attenuator 502, and/or an impedance matching network. Although any number of systems, in whole or in part, can implement the process 700, to simplify the discussion, portions of the process 700 will be described with reference to particular systems.

The process 700 begins at block 702 where, for example, the current comparator 236 monitors a base current (e.g., ICsd) of a common base transistor 212 in a cascode power amplifier 208 of the power amplifier 204. At block 704, the current comparator 236 monitors a base current (e.g., IRF) of a common emitter transistor 210 in the cascode power amplifier 208. At block 706, the current comparator 236 compares the base current of the common base transistor 212 to the base current of the common emitter transistor 210 to obtain a cascode PA current ratio. As previously described, the comparison of the base currents of the transistors of the cascode PA 208 may be used to determine whether a transistor of the cascode PA 208 is in saturation, thereby indicating whether the PA 204 is in compression. Further, as previously described, in certain embodiments, by comparing the base currents of the cascode PA 208 transistors instead of Beta, the PA 204 can be simplified, saving both power and cost by eliminating elements to measure and compare Beta to determine whether the PA 204 is in compression.

At decision block 708, the saturation controller 240 determines whether the cascode PA current ratio exceeds or satisfies a threshold. If not, the process 700 returns to block 702. If the cascode PA current ratio exceeds or satisfies the ratio, the saturation controller 240 at block 710 modifies, or causes to be modified, at least one of the following: the DC supply voltage of the PA 204, the RF input signal supplied to the PA 204, and/or the load at the output of the PA 204. As previously described, a device may be configured to modify one, or more than one, of the DC supply voltage, the RF input signal, and/or the load at the output of the PA. In embodiments where the device can modify multiple operating characteristics of the PA 204, the saturation controller 240 may select whether to modify the supply voltage, RF input signal, and/or load of the PA 204 based on the operating environment of the wireless device and/or based on a command from a base station.

Example Timing Diagram

Figure 8:
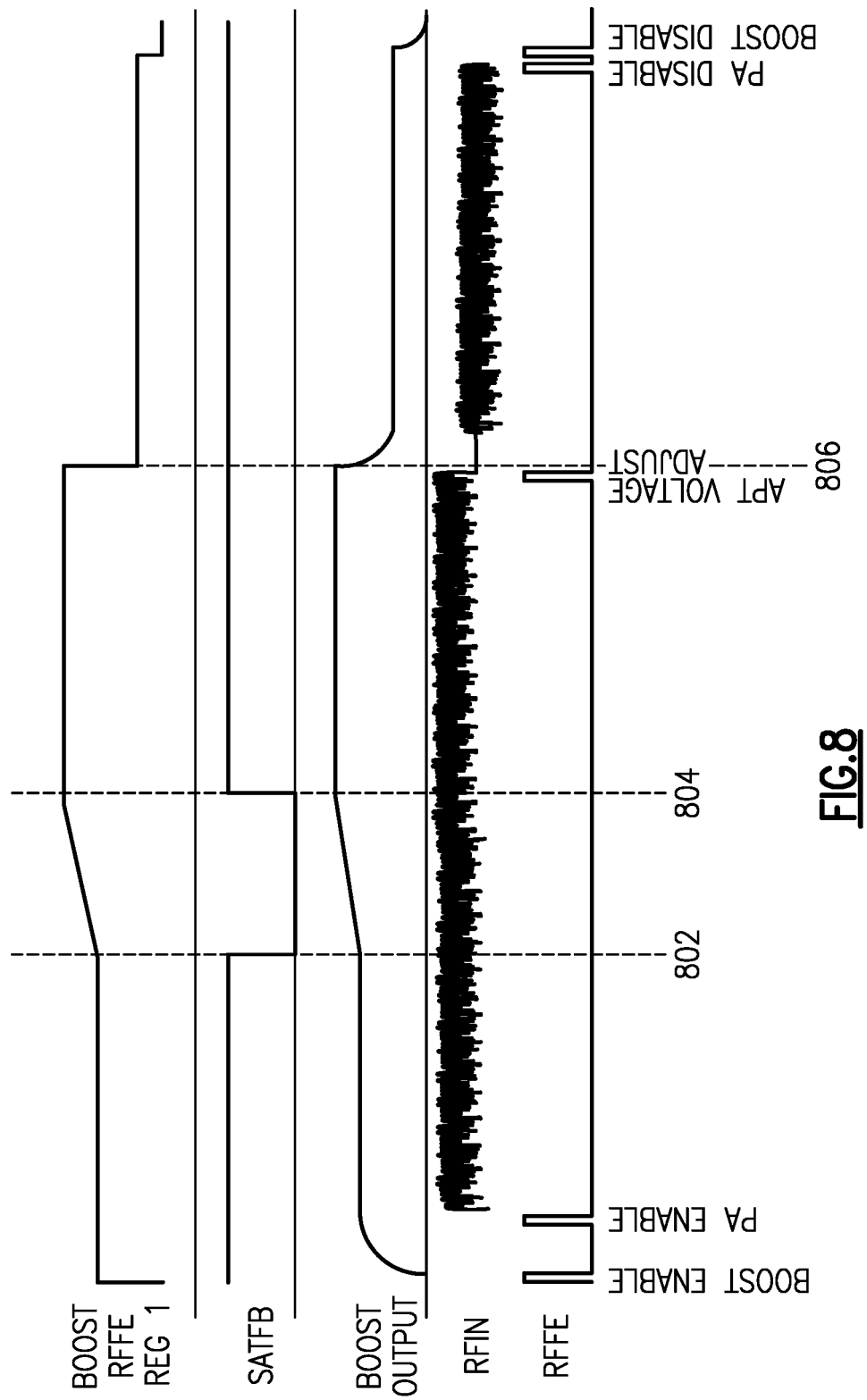
FIG. 8 illustrates an example of a timing diagram for saturation detection and compensation.

FIG. 8 illustrates an example of a timing diagram for saturation detection and compensation. Starting on the left side of the timing diagram and at the bottom, a data input stream to the RFFE core 304 is illustrated. Each of the pulses may represent a serial-data stream. A number of operations may occur during each pulse and the timing diagram is simplified to generally illustrate that information is transferred over the RFFE bus to the PA. As indicated in FIG. 8, the first command enables the boost supply from the boost converter 242. As a result, the timing diagram illustrates that the boost output voltage begins to rise subsequent to the first pulse. Further, the boost RFFE Register 1 is programmed with the boost level, which may be determined form the APT table. At the PA enable pulse, the PA 204 is activated and receives a supply voltage based on the DAC 310 output. Further, the PA 204 begins to receive an RF input signal. Further, the timing diagram illustrates that the PA 204 is not in saturation.

At point 802, an event occurs, such as the antenna impedance being modified, and results in the load to the PA 204 being adjusted. As a result the PA 204 may begin compressing as a transistor of the PA 204 begins to saturate. The saturation is illustrated in the timing diagram by the SATFB signal being pulled low.

In certain embodiments, the SATFB signal being pulled low triggers an increase in the boost RFFE output. The ramp generator 308 is incremented resulting in the reference signal from the DAC 310 being modified. The modified reference signal may cause the boost converter 242 to increase the supply voltage provided to the collector of the PA 204. The supply voltage may continue to increase until at some point the PA 204 comes out of saturation as illustrated at point 804. Once the PA 204 is no longer saturated, the SATFB signal goes high signifying that the saturation controller 240 can stop incrementing the collector voltage of the PA 204, or the boost output. In certain embodiments, the supply voltage is boosted, or is raised, above the battery voltage that is provided to the PAM 202.

In the example timing diagram, once the PA 204 is out of saturation, everything remains constant until a point 806 a command is received to adjust the target power. This command may be received from the call processor 434 in response to a command received from the base station. In the illustrated example, the target power is reduced, which may occur as a wireless device moves closer to a base station. If the wireless device were instead moving farther from the base station, the target power may be increased and the timing diagram may illustrate an increase in the voltage boost instead of a decrease. The base station may request that a wireless device modify its target power to prevent interference with other uses in communication with the base station. For example, if the base station is configured with to use Code Division Multiple Access (CDMA), which is a spread spectrum communication standard, multiple wireless devices may transmit at the same frequency using different codes. So that the base station can receive the signals from each of the wireless devices, it is desirable for the power levels to be roughly equal. If a wireless device transmits at a much higher power level, the wireless device may act as a block to other wireless devices. Thus, it is desirable to maintain a constant power level.

In response to the request to reduce the target power, the wireless device may access an APT table in the memory 418 to identify a corresponding target voltage for the target power and may cause the saturation controller to adjust the boost accordingly so that the output power is reduced. Further, the RFFE core 304 may receive a new initial or default value, which is stored at the shadow register 306. If the PA 204 begins to compress, the new initial value that is provided to the saturation controller 240 is incremented using the ramp clock generator 312 to adjust the reference signal provided by the saturation controller 240 to adjust the supply voltage provided to the PA 204. Each time a new APT value is received, the saturation controller 240 may be reset by providing a reset signal to the ramp generator 308 and may receive a new default value at the RFFE core 304 corresponding to the target APT voltage.

In certain embodiments, the transition to reduce power may take a non-zero amount of time. As such, during the voltage transition time, the modulation is ceased. This is illustrated by the flat line in the RF input line of the timing diagram. The timing to adjust the voltage may be small. For example, timing for the voltage adjustment may be on the order of 25-microseconds. Once the timing window is over and the voltage adjustment is completed, the modulation is restored as illustrated in the example timing diagram of FIG. 8. If the wireless device is deactivated, or the wireless functionality of the device is deactivated (e.g., a non-transmission mode), the PA and voltage boost may be deactivated as illustrated by the last two pulses in the timing diagram.

Simulation Results

Figure 9:
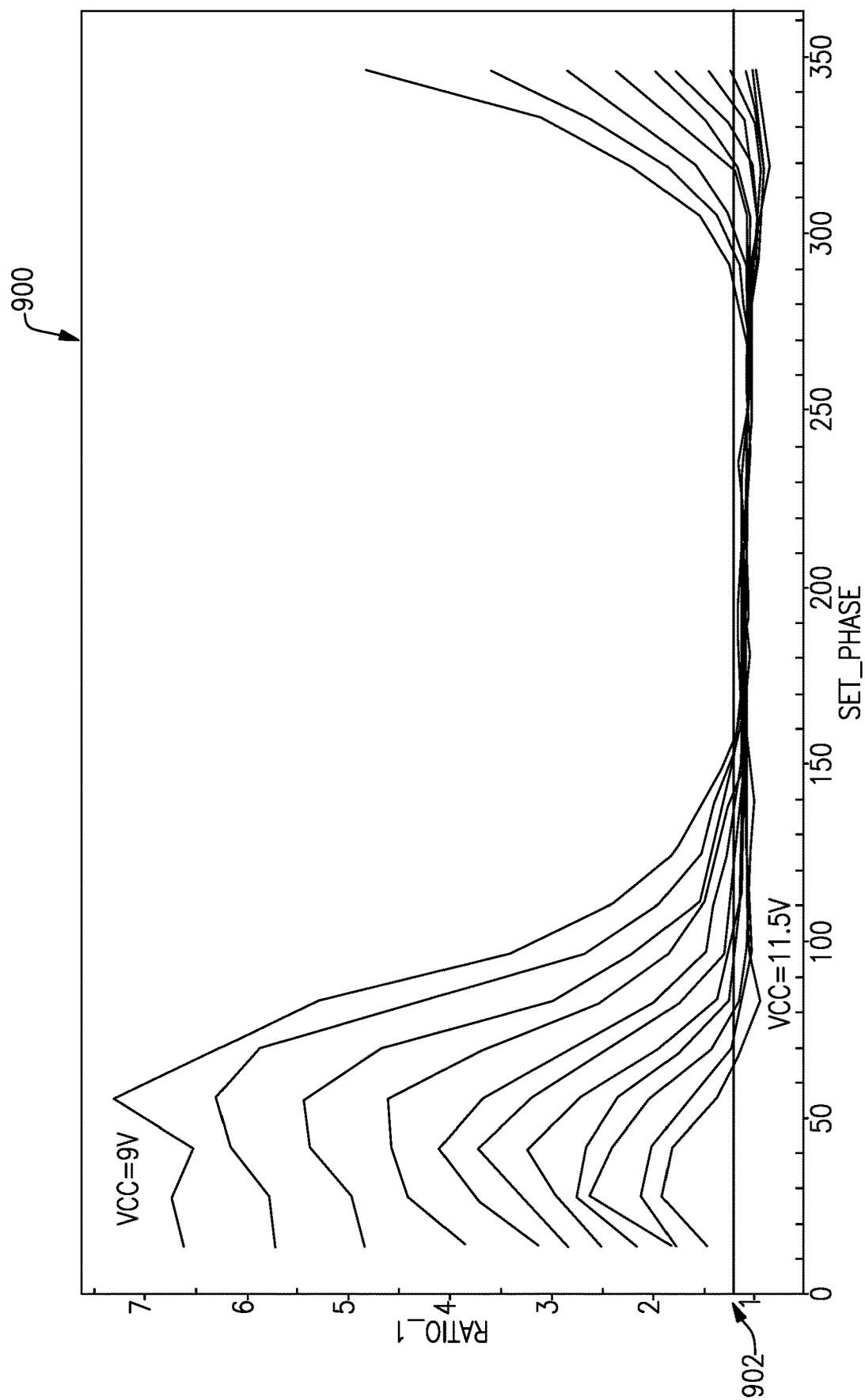
FIG. 9 illustrates a graph comparing the base current for the common base transistor to the base current of the common emitter transistor of a cascode power amplifier for a 2:1 VSWR (Voltage Standing Wave Ratio).

FIG. 9-12 illustrate several graphs corresponding to simulations performed with a VSWR of 2:1 (or 2 to 1). The 2:1 VSWR value is often used for testing power amplifiers. FIG. 9 illustrates a graph 900 that compares the base current for the common base transistor to the base current of the common emitter transistor of a cascode power amplifier for a 2:1 VSWR. The graph 900 includes a number of lines that each correspond to a different voltage level between Vcc of 11.5 volts for the lowest line in the graph 900 and Vcc of 9 volts for the highest line in the graph. The ratio during which the PA is considered to be in saturation may vary based on process and specifications. For this particular simulation, saturation is determined to occur when there is a 20% difference between the current values, or a ratio of 1.2. When the voltage lines are above the 1.2 current ratio line 902, the simulated PA is considered to be saturated and when the voltage lines are below the 1.2 current ratio line 902, the simulated PA is considered to be not saturated.

Figure 10:
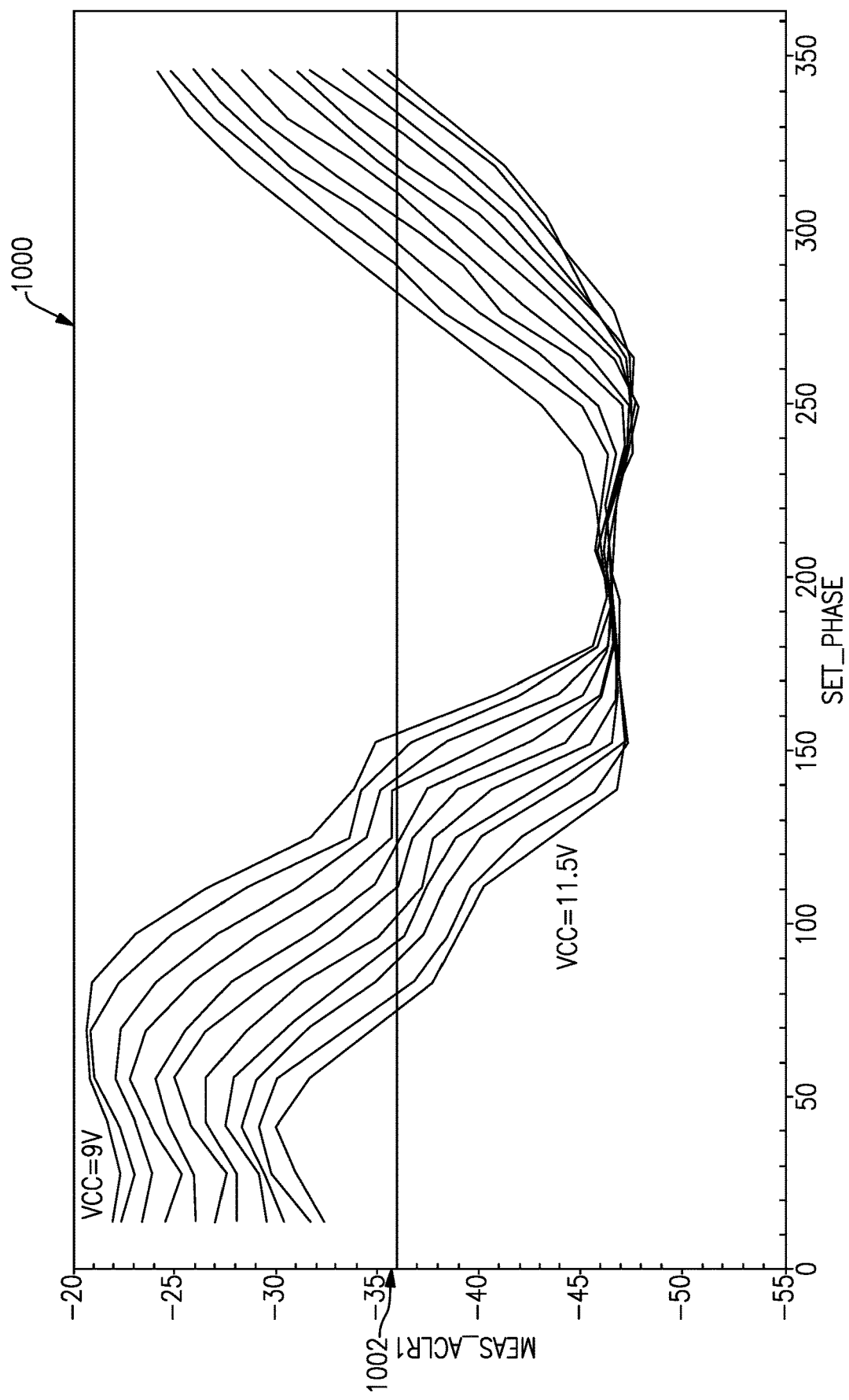
FIG. 10 illustrates a graph that depicts Adjacent Channel Leakage Ratio (ACLR) as a function of load for the 2:1 VSWR case of FIG. 9.

FIG. 10 illustrates a graph 1000 that depicts Adjacent Channel Leakage Ratio (ACLR) as a function of load for the 2:1 VSWR case of FIG. 9. The ACLR graph 1000 illustrates a measurement of spectrum in the channel directly adjacent to the spectrum utilized by a wireless device to determine how much of the transmitted signal is leaking into the spectrum of another wireless device, or into the adjacent channel. The distortion that occurs when the PA 204 saturates may cause the spectrum of the wireless device to leak in to the spectrum of another wireless device. For this particular simulation, saturation is determined to occur when there is more −36 dB leakage (as illustrated by horizontal line 1002). Embodiments herein detect the spectrum leakage and reduce or eliminate the leakage by detecting PA compression and eliminating the compression. The information of FIG. 9 can be crossed with the information of FIG. 10 to determine the effectiveness of embodiments herein for detecting saturation and spectrum leakage across various voltage values for a simulated PA.

Figure 11:
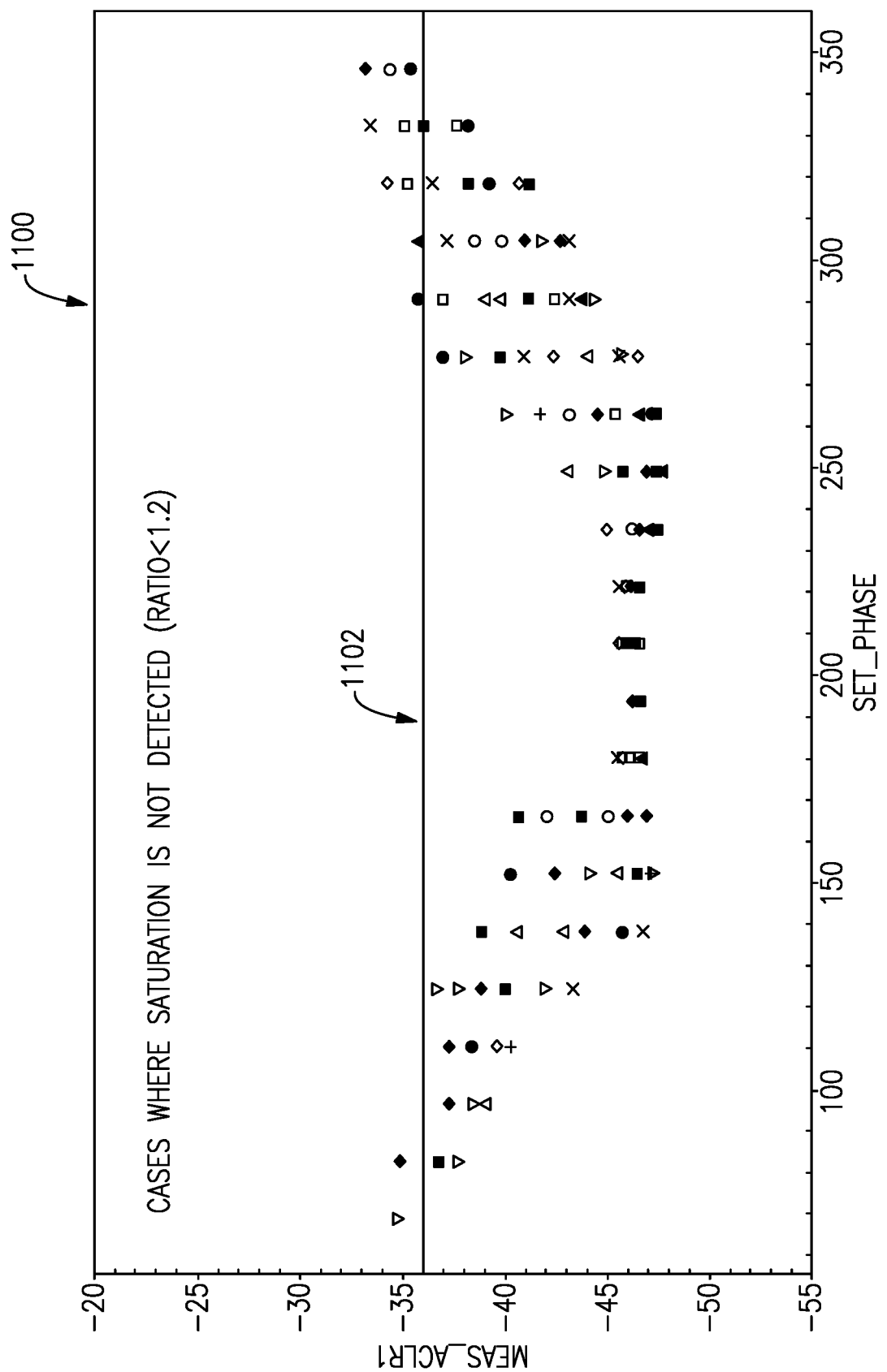
FIG. 11 illustrates a graph depicting the cases where saturation is not detected when correlating the saturation detection and ACLR of FIGS. 9 and 10 with embodiments described herein.

FIG. 11 illustrates a graph 1100 depicting the cases where saturation is not detected when correlating the saturation detection and ACLR of FIGS. 9 and 10 with embodiments described herein. As stated previously, when the current ratio is 1.2, or greater, the PA is considered to be in compression with a transistor of the PA operating in a state of saturation. The points on the graph 1100 are measurement points where saturation is not detected by a simulated saturation controller. The line 1102 at −36 dB indicates the transition between when the simulated PA is considered to be in saturation.

The Y-axis represents ACLR, and the horizontal line 1102 marked at −36 dB represents the maximum acceptable adjacent channel leakage for release 99 of the $3^{rd}$ Generation Partnership Project (R99 3GPP) specification selected for the simulation. The R99 3GPP relates to development of a 3G mobile phone system based on the Global System for Mobile Communications (GSM) specification. The R99 3GPP specification requires that leakage into the adjacent channel does not occur any higher than −36 dBc. Each one of the symbols in the graph 1100 is a measured data point for the ACLR where the current comparator 236 of the simulated PA does not indicate saturation. Thus, during the simulation, the two base currents of the RF device and the cascode device were measured and compared. If the resultant comparison is less than 20% or the ratio is less than 1.2, it is determined that the PA is not in saturation. In the graph 1100, each of the measured data points has a ratio less than 1.2. The measured data points are correlated with the ACLR. The different symbols used to indicate the measured data points correspond to different voltage values between 9 volts and 11.5 volts used for the simulation.

Figure 12:
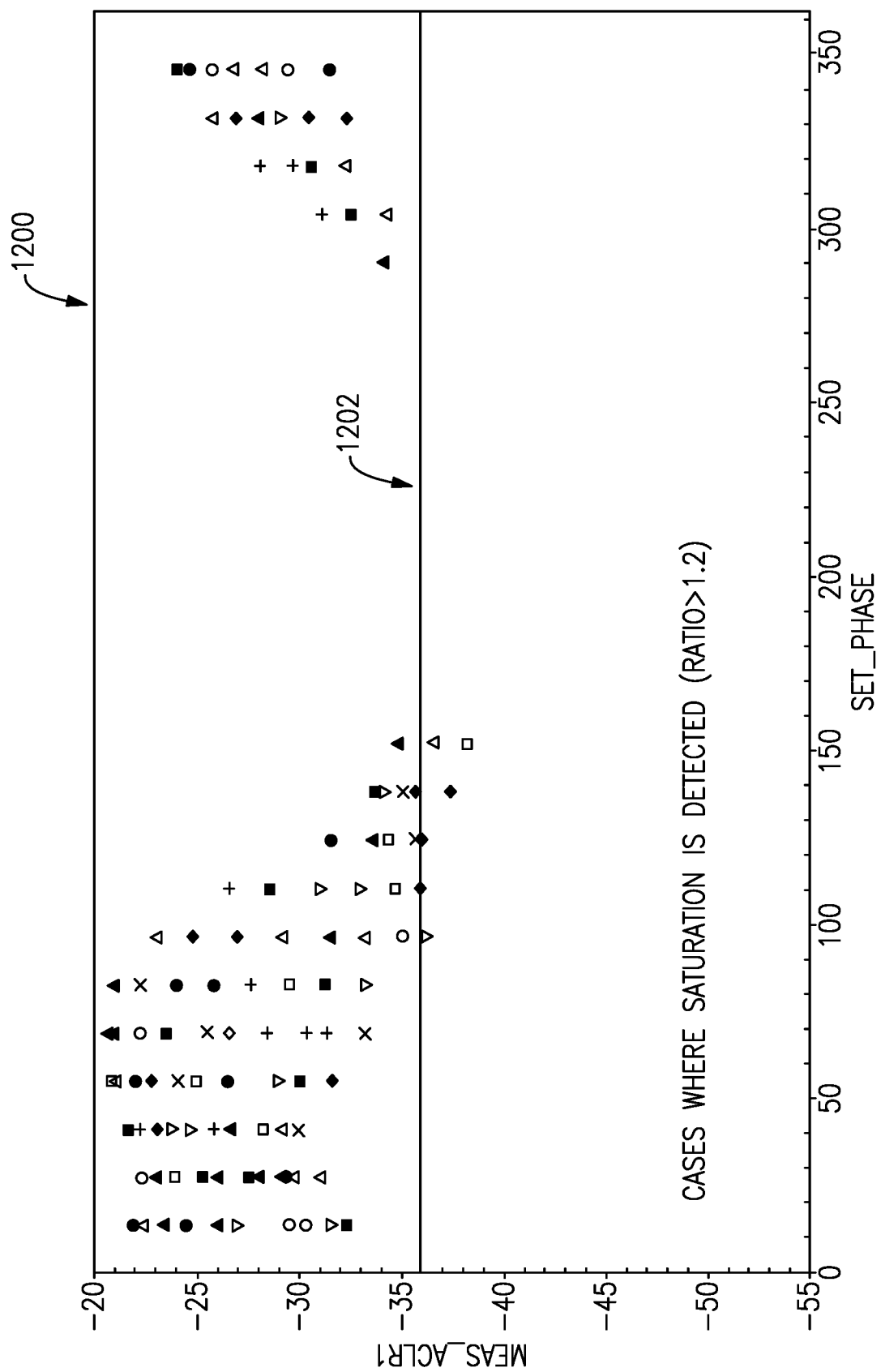
FIG. 12 illustrates a graph depicting the cases where saturation is detected when correlating the saturation detection and ACLR of FIGS. 9 and 10 with embodiments described herein.

As previously mentioned, the line 1102 marks the threshold of maximum acceptable ACLR. As can be seen in the graph 1100, most of the points indicating that the PA is not in compression or saturated are below the line 1102 indicating acceptable ACLR when saturation is not detected. FIG. 12 illustrates a graph 1200 depicting the cases where saturation is detected when correlating the saturation detection and ACLR of FIGS. 9 and 10 with embodiments described herein. The line 1202 corresponds to the line 1102 indicating the threshold for acceptable ACLR. The points illustrated in the graph 1200 indicate occurrences of saturation that were detected by the simulated saturation controller 240. In other words, points where the current comparator 236 determined that the current ratio is greater than 20% of greater than 1.2. As illustrated in the graph 1200, most of the points indicating PA compression are above the line 1202 indicating unacceptable ACLR when saturation is detected.

Thus, as can be seen by comparing the graphs 1100 and 1200, the graphs indicates that the simulated system can detect occurrences of saturation a majority of the time using the embodiments described herein to compare base currents of the cascode PA. Once saturation is detected, one or more of the embodiments described herein may be applied to take the PA out of saturation.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier module comprising:
  a power amplifier including a cascode transistor pair, the cascode transistor pair including a first transistor and a second transistor;
  a current comparator configured to compare a first base current of the first transistor and a second base current of the second transistor to obtain a comparison value; and
  a saturation controller configured to supply a reference signal to an impedance matching network based on the comparison value, the impedance matching network being configured to modify a load impedance of a load line in electrical communication with the power amplifier based at least in part on the reference signal.

2. The power amplifier module of claim 1 wherein the first transistor is a common base transistor and the second transistor is a common emitter transistor.

3. The power amplifier module of claim 1 wherein the load line is in electrical communication with an antenna and the load line is electrically located between the power amplifier and the antenna.

4. The power amplifier module of claim 1 wherein the impedance matching network is a dynamic impedance matching network.

5. The power amplifier module of claim 1 wherein the saturation controller is further configured to reduce compression of the power amplifier by modifying the load impedance of the load line.

6. The power amplifier module of claim 1 wherein the saturation controller further includes a digital-to-analog converter and a ramp generator, the ramp generator being configured to supply a count value to the digital-to-analog converter, the digital-to-analog converter being configured to generate the reference signal based at least in part on the count value.

7. The power amplifier module of claim 6 wherein the saturation controller includes a pull-down resistor in electrical communication with the current comparator, a voltage input/output pin and a ramp clock generator, the ramp clock generator being configured to detect whether the first transistor is operating in a saturation region based on a voltage across the pull-down resistor, the voltage being based at least in part on the comparison value, and in response to detecting that the first transistor is operating in the saturation region, the ramp clock generator being configured to cause the ramp generator to modify the count value.

8. The power amplifier module of claim 6 wherein the digital-to-analog converter is further configured to generate the reference signal based at least in part on an average power tracking value, the average power tracking value being determined based on a target power signal received from a base station.

9. The power amplifier module of claim 6 wherein the saturation controller further includes a radio-frequency front end configured to receive a default data value from a saturation data pin, the count value initially corresponding to the default data value.

10. The power amplifier module of claim 9 wherein the default data value is one of a plurality of default data values, the default data value being selected based on a target voltage.

11. The power amplifier module of claim 10 wherein the target voltage is determined based at least in part on a target power signal received from a base station.

12. The power amplifier module of claim 1 further comprising a boost converter configured to regulate a supply voltage provided to the power amplifier.

13. The power amplifier module of claim 12 wherein the saturation controller is further configured to reduce compression of the power amplifier by a combination of providing a second reference signal to the boost converter to increase the supply voltage and modifying the load impedance of the load line by supplying the reference signal to the impedance matching network.

14. A transceiver comprising:
an impedance matching network configured to modify, based on a reference signal, a load impedance of a load line in electrical communication with a power amplifier and an antenna; and
a power amplifier module including the power amplifier, a current comparator, and a saturation controller, the power amplifier including a cascode transistor pair, the cascode transistor pair including a first transistor and a second transistor, the current comparator configured to compare a base current of the first transistor and a base current of the second transistor to obtain a comparison value, the saturation controller being configured to generate the reference signal based at least in part on the comparison value and to provide the reference signal to the impedance matching network.

15. The transceiver of claim 14 wherein the impedance matching network is a dynamic impedance matching network.

16. The transceiver of claim 14 wherein the saturation controller further includes a digital-to-analog converter and a ramp generator, the ramp generator being configured to supply a count value to the digital-to-analog converter, the digital-to-analog converter being configured to generate the reference signal based at least in part on the count value.

17. The transceiver of claim 16 wherein the saturation controller includes a pull-down resistor in electrical communication with the current comparator, a voltage input/output pin and a ramp clock generator, the ramp clock generator being configured to detect whether the first transistor is operating in a saturation region based on a voltage across the pull-down resistor, the voltage being based at least in part on the comparison value, and the ramp clock generator being configured to, in response to detecting that the first transistor is operating in the saturation region, cause the ramp generator to modify the count value.

18. The transceiver of claim 14 further comprising a boost converter configured to regulate a supply voltage provided to the power amplifier.

19. The transceiver of claim 14 wherein the saturation controller is further configured to reduce compression of the power amplifier by a combination of providing a second reference signal to the boost converter to increase the supply voltage and modifying the load impedance of the load line by supplying the reference signal to the impedance matching network.

20. A wireless device comprising:
an antenna configured to at least transmit a signal from a transceiver, the signal being based at least in part on a radio frequency input signal supplied to a power amplifier of the transceiver; and
the transceiver including an impedance matching network and a power amplifier module, the impedance matching network being configured to modify, based on a reference signal, a load impedance of a load line in electrical communication with the power amplifier and the antenna, the power amplifier module including the power amplifier, a current comparator, and a saturation controller, the power amplifier including a cascode transistor pair, the cascode transistor pair including a first transistor and a second transistor, the current comparator configured to compare a base current of the first transistor and a base current of the second transistor to obtain a comparison value, the saturation controller being configured to generate the reference signal based at least in part on the comparison value and to provide the reference signal to the impedance matching network.

* * * * *